US012696457B2

(12) United States Patent
Lee et al.

(10) Patent No.:  US 12,696,457 B2
(45) Date of Patent:       Jul. 28, 2026

(54) THREE-DIMENSIONAL SEMICONDUCTOR MEMORY DEVICE AND METHOD OF FABRICATING THE SAME

(71) Applicant: Samsung Electronics Co., Ltd., Suwon-si (KR)

(72) Inventors: Jeon Il Lee, Suwon-si (KR); Kyunghwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 470 days.

(21) Appl. No.: 18/198,411

(22) Filed: May 17, 2023

(65) Prior Publication Data

US 2024/0107773 A1      Mar. 28, 2024

(30) Foreign Application Priority Data

Sep. 27, 2022    (KR) ........................ 10-2022-0122302

(51) Int. Cl.
| | |
|---|---|
| *H10B 51/20* | (2023.01) |
| *G11C 16/04* | (2006.01) |
| *H10B 51/10* | (2023.01) |
| *H10B 51/40* | (2023.01) |

(52) U.S. Cl.
CPC ......... *H10B 51/20* (2023.02); *G11C 16/0483* (2013.01); *H10B 51/10* (2023.02); *H10B 51/40* (2023.02)

(58) Field of Classification Search
CPC ........ H10B 51/20; H10B 51/10; H10B 51/40; G11C 16/0483
See application file for complete search history.

(56) References Cited

U.S. PATENT DOCUMENTS

| | | | |
|---|---|---|---|
| 5,640,259 A | 6/1997 | Sawayama et al. | |
| 10,199,389 B2 | 2/2019 | Kim et al. | |
| 10,937,808 B2 | 3/2021 | Lee et al. | |
| 11,049,880 B2 | 6/2021 | Rajashekhar et al. | |
| 11,244,959 B2 | 2/2022 | Yoo et al. | |
| 2020/0111800 A1* | 4/2020 | Ramaswamy | ....... H10B 12/033 |
| 2021/0074727 A1 | 3/2021 | Prasad et al. | |
| 2021/0399017 A1 | 12/2021 | Sun et al. | |
| 2021/0408046 A1 | 12/2021 | Chang et al. | |
| 2022/0020775 A1 | 1/2022 | Yang et al. | |
| 2022/0028894 A1 | 1/2022 | Yang et al. | |

(Continued)

FOREIGN PATENT DOCUMENTS

| | | | |
|---|---|---|---|
| JP | | 2974564 B2 | 11/1999 |
| KR | 10-2020-0044215 A | | 4/2020 |

(Continued)

*Primary Examiner* — Afroza Chowdhury
(74) *Attorney, Agent, or Firm* — Sughrue Mion, PLLC

(57) ABSTRACT

A semiconductor memory device includes a cell string and a first conductive pillar and a second conductive pillar connected to the cell string. The cell string includes plural memory cells, which are stacked on a substrate to be spaced apart from each other. The first conductive pillar is spaced apart from the second conductive pillar in a first direction. Each of the memory cells includes a channel layer that extends from the first conductive pillar to the second conductive pillar in the first direction, a ferroelectric layer on the channel layer, and an electrode on the ferroelectric layer. The channel layer comprises single crystalline silicon.

19 Claims, 29 Drawing Sheets

(56) References Cited

U.S. PATENT DOCUMENTS

| | | | |
|---|---|---|---|
| 2022/0052060 A1 | 2/2022 | Young et al. | |
| 2022/0367516 A1 | 11/2022 | Chia et al. | |
| 2023/0019688 A1* | 1/2023 | Kao | H10D 1/716 |

FOREIGN PATENT DOCUMENTS

| | | |
|---|---|---|
| KR | 10-2021-0148824 A | 12/2021 |
| KR | 10-2336739 B1 | 12/2021 |

* cited by examiner

Figure 15B:
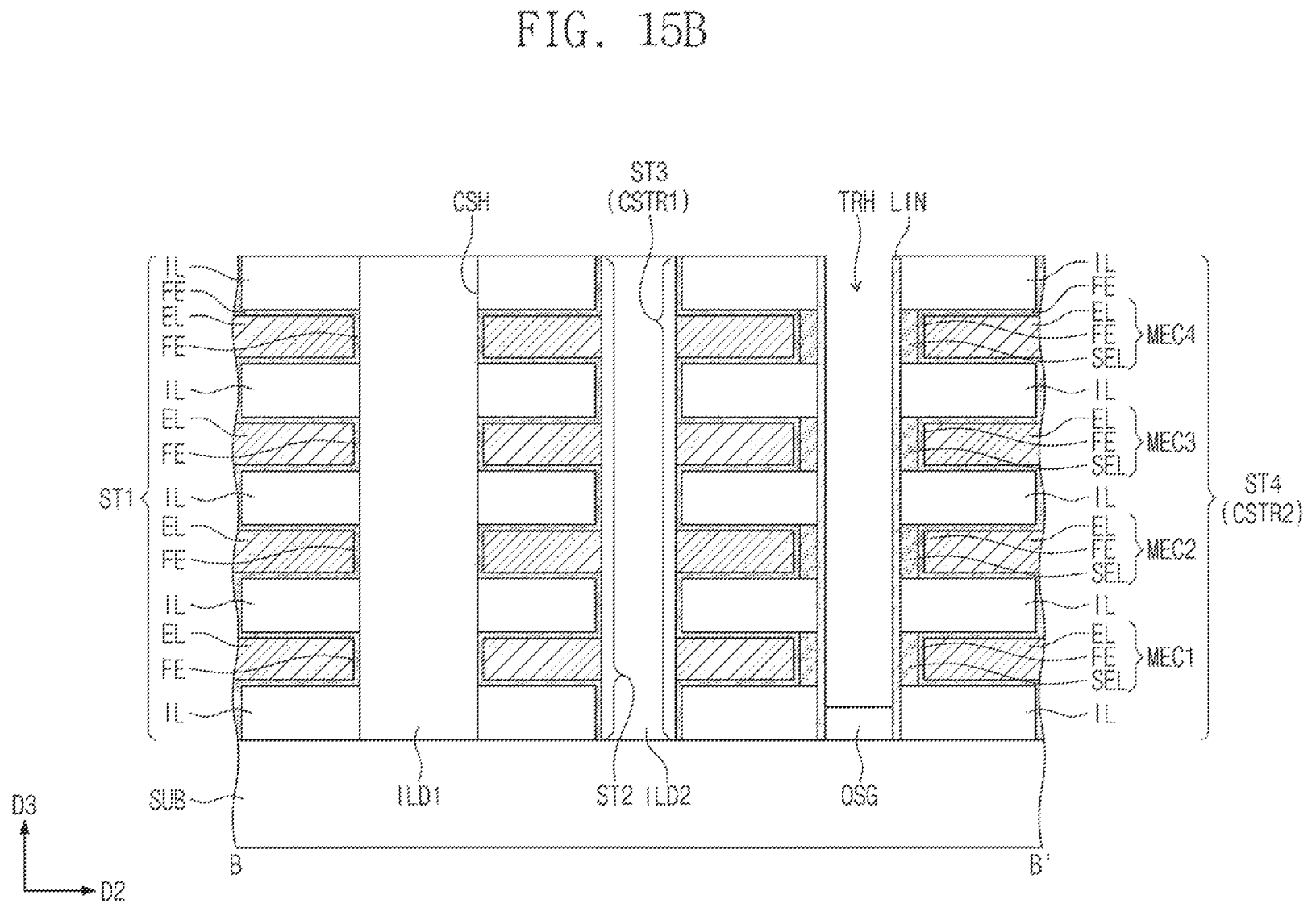

ST4
(CSTR2)

MEC4
IIL
FE
EL
FE
SEL

MEC3
IIL
EL
FE
SEL

MEC2
IIL
EL
FE
SEL

MEC1
IIL
EL
FE
SEL
IIL

TRH LIN

ST3
(CSTR1)

CSH

OSG

ST2 ILD2

ILD1

ST1
IIL
FE
EL
FE
IIL
EL
FE
IIL
EL
FE
IIL
EL
FE
IIL

SUB

THREE-DIMENSIONAL SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0122302, filed on Sep. 27, 2022, in the Korean Intellectual Property Office, the entire contents of which are hereby incorporated by reference.

BACKGROUND

The present disclosure relates to a three-dimensional semiconductor memory device and a method of fabricating the same, and in particular, to a three-dimensional ferroelectric memory device and a method of fabricating the same.

Semiconductor memory devices are generally classified into volatile memory devices and nonvolatile memory devices. The volatile memory devices lose their stored data when their power supplies are interrupted, and for example, include a dynamic random access memory (DRAM) device and a static random access memory (SRAM) device. The nonvolatile memory devices maintain their stored data even when their power supplies are interrupted and, for example, include a programmable read only memory (PROM), an erasable PROM (EPROM), an electrically EPROM (EE-PROM), a flash memory device. Meanwhile, to meet an increasing demand for a semiconductor memory device with high performance and low power consumption, next-generation nonvolatile semiconductor memory devices, such as magnetic random access memory (MRAM), phase-change random access memory (PRAM), and ferroelectric random access memory (FeRAM) devices, are being developed.

In addition, as a semiconductor device with high integration density and high performance is required, various studies are being conducted to develop semiconductor devices having different properties.

SUMMARY

It is an aspect to provide a three-dimensional semiconductor memory device with improved electrical characteristics.

It is another aspect to provide a method of fabricating a three-dimensional semiconductor memory device with improved electrical characteristics.

According to an aspect of one or more embodiments, a semiconductor memory device may include a cell string including a plurality of memory cells, the plurality of memory cells being stacked on a substrate to be spaced apart from each other; and a first conductive pillar and a second conductive pillar connected to the cell string. The first conductive pillar is spaced apart from the second conductive pillar in a first direction. Each of the plurality of memory cells may comprise a channel layer that extends from the first conductive pillar to the second conductive pillar in the first direction; a ferroelectric layer on the channel layer; and an electrode on the ferroelectric layer. The channel layer may comprise single crystalline silicon.

According to another aspect of one or more embodiments, a semiconductor memory device may include a stack on a substrate; a conductive pillar, which is provided adjacent to the stack and extends in a vertical direction; and an insulating pattern between the conductive pillar and the substrate. The stack may comprise electrodes stacked on the substrate; a ferroelectric layer covering the electrodes; and channel layers, which are respectively interposed between the electrodes and the conductive pillar. The channel layers may be vertically spaced apart from each other, and the insulating pattern may electrically disconnect the conductive pillar from the substrate.

According to yet another aspect of one or more embodiments, a semiconductor memory device may include a first cell string and a second cell string on a substrate; and a first conductive pillar and a second conductive pillar between the first cell string and the second cell string. The first conductive pillar may be spaced apart from the second conductive pillar in a first direction. The first cell string may be spaced apart from the second cell string in a second direction. Each of the first cell string and the second cell string may comprise electrodes stacked on the substrate; channel layers, which are respectively disposed adjacent to the electrodes and are vertically spaced apart from each other, each of the channel layers connecting the first conductive pillar to the second conductive pillar; and a ferroelectric layer interposed between the electrodes and the channel layers. The ferroelectric layer may cover a top surface, a bottom surface, and a first side surface of each of the electrodes.

BRIEF DESCRIPTION OF THE DRAWINGS

FIG. 2 is a plan view illustrating a three-dimensional semiconductor memory device according to some embodiments.

FIG. 3A is a sectional view taken along a line A-A' of FIG. 2.

Figure 16:
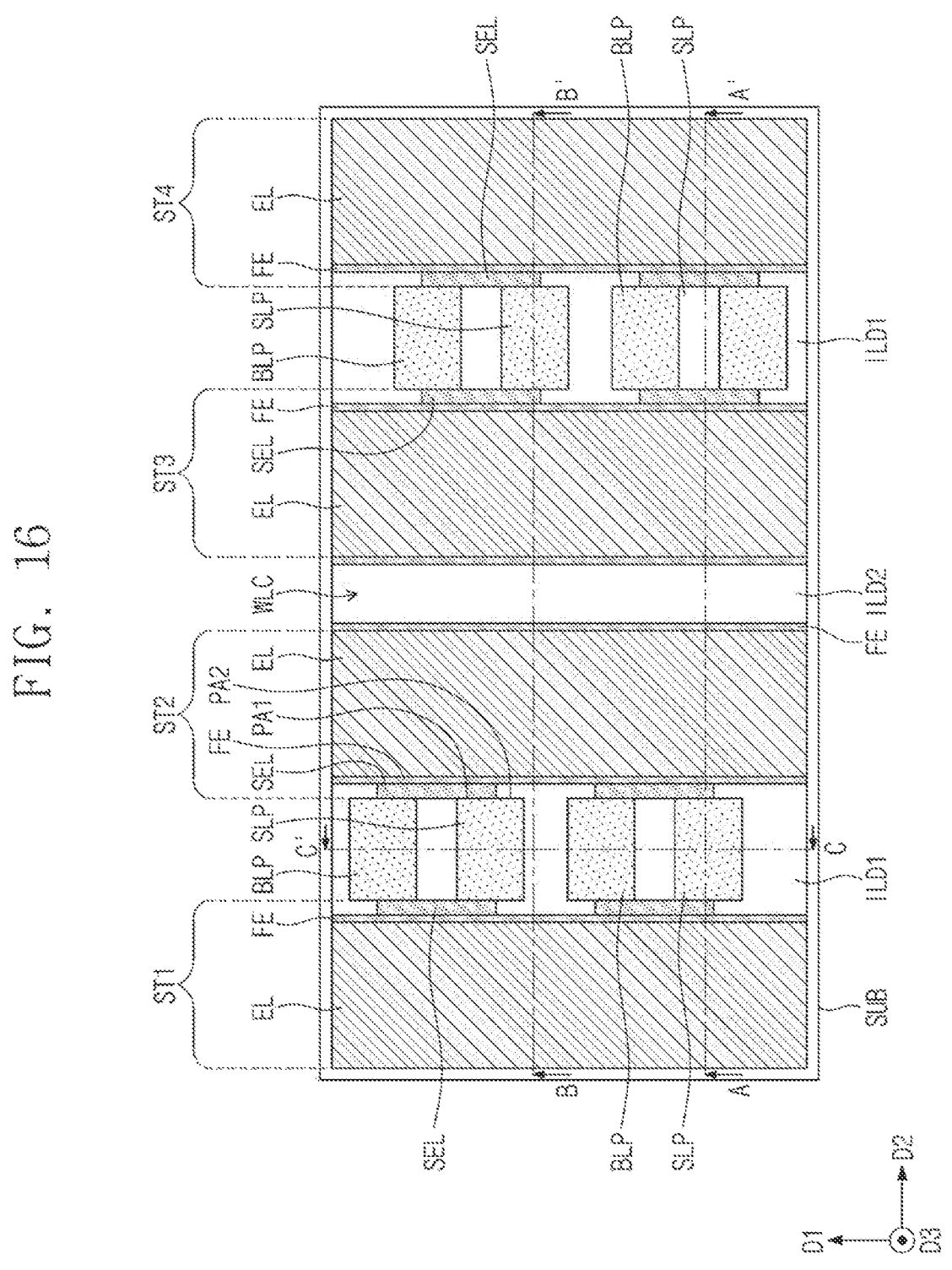
Figure 14:
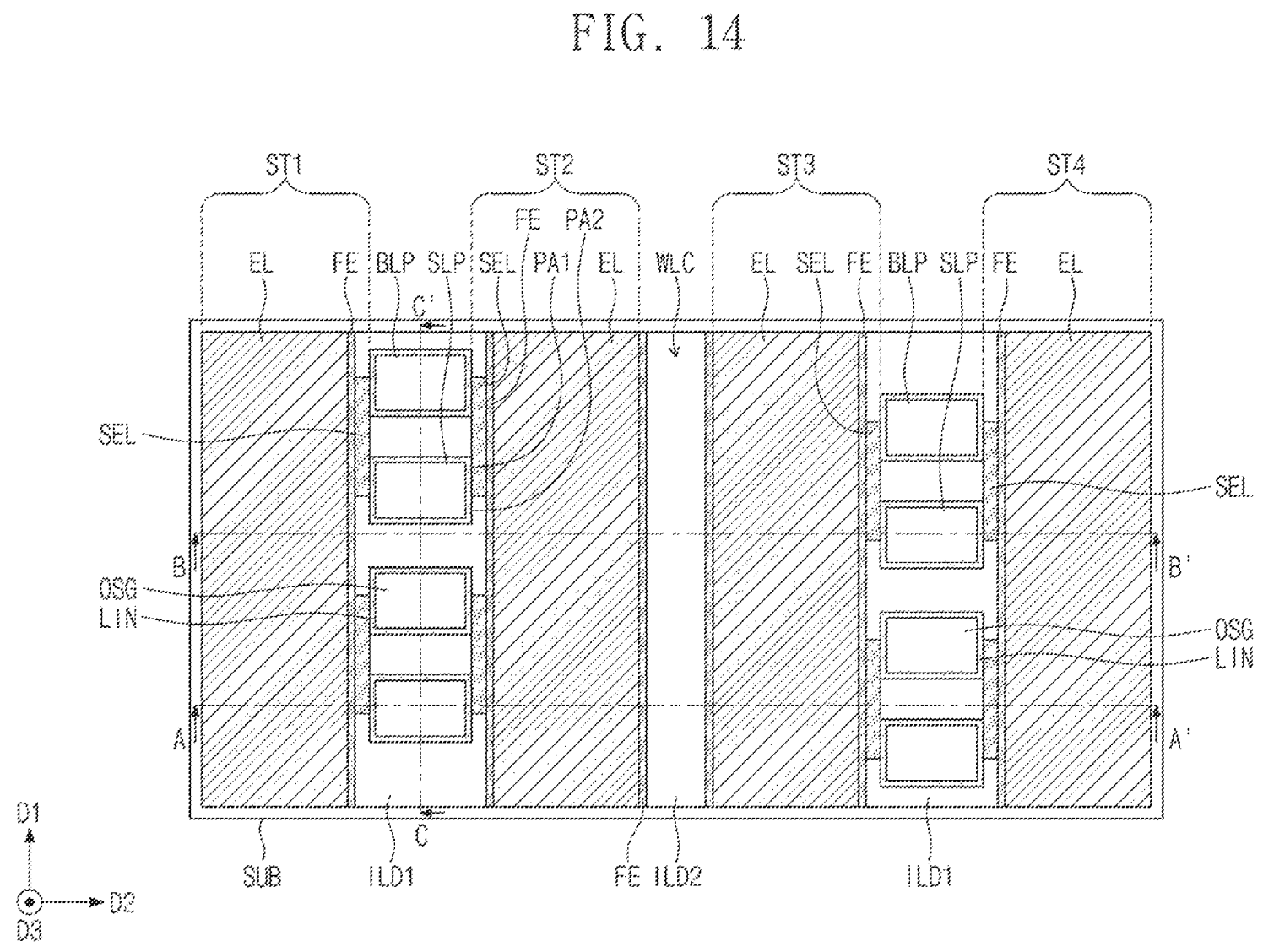

FIGS. 6, 8, 10, 12, 14, and 16 are plan views illustrating a method of fabricating a three-dimensional semiconductor memory device, according to some embodiments.

FIGS. 7, 9, 11A, 13A, 15A, and 17A are sectional views taken along lines A-A' of FIGS. 6, 8, 10, 12, 14, and 16, respectively.

Figure 17B:
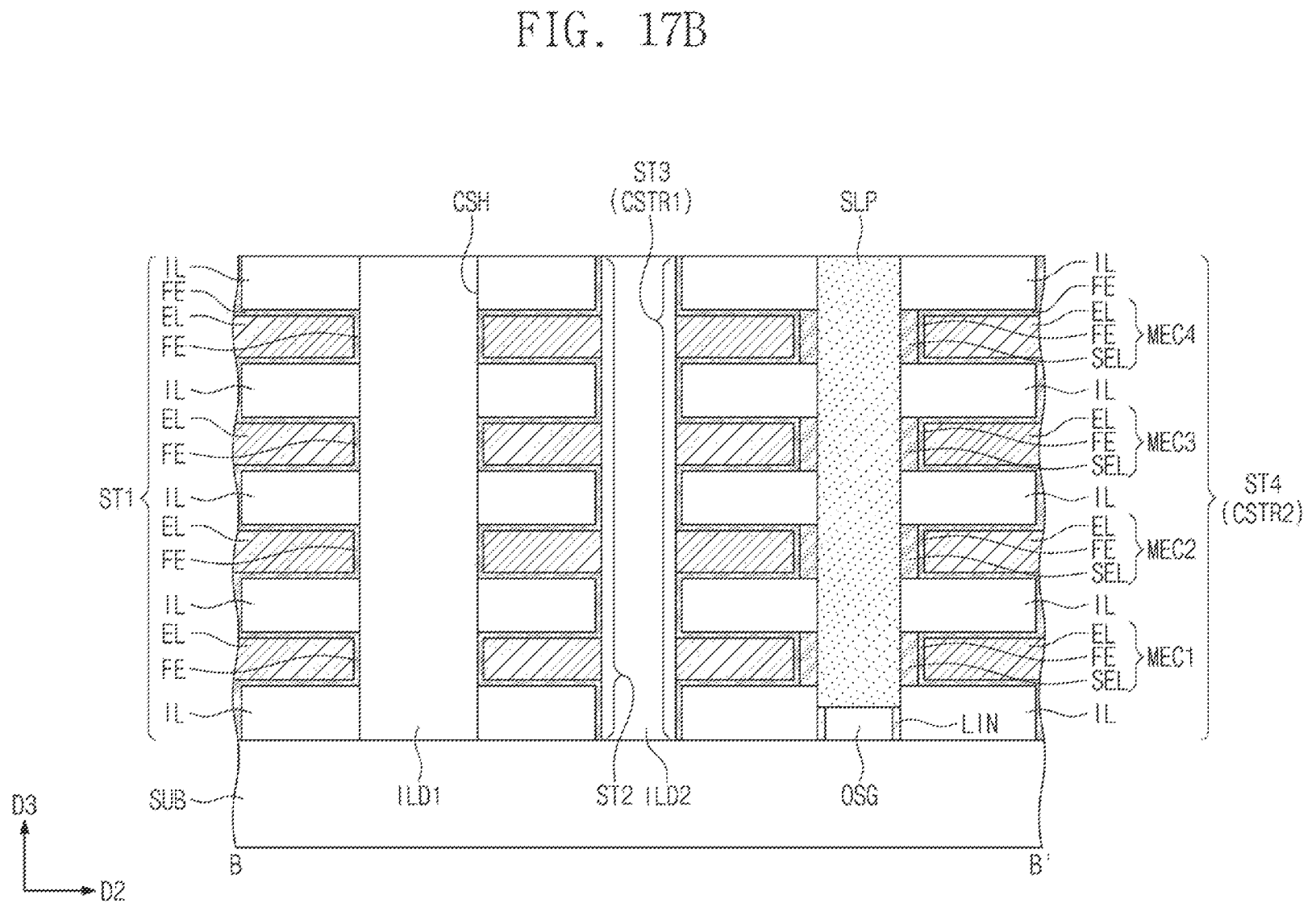

FIGS. 11B, 13B, 15B, and 17B are sectional views taken along lines B-B' of FIGS. 10, 12, 14, and 16, respectively.

DETAILED DESCRIPTION

Figure 1:
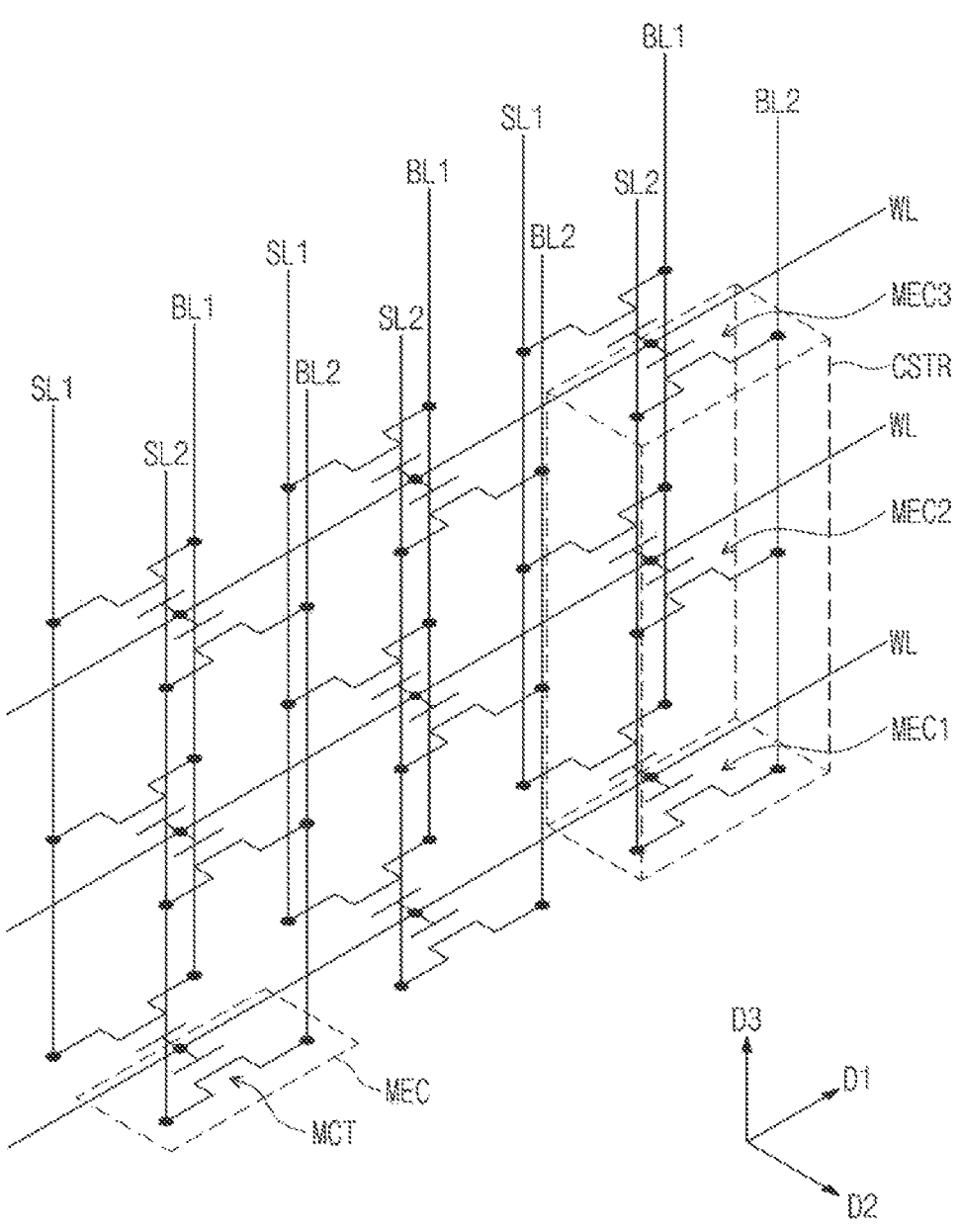
FIG. 1 is a circuit diagram schematically illustrating a cell array of a three-dimensional semiconductor memory device according to some embodiments.

FIG. 1 is a circuit diagram schematically illustrating a cell array of a three-dimensional semiconductor memory device according to some embodiments. Referring to FIG. 1, the three-dimensional semiconductor memory device may include word lines WL, bit lines BL, source lines SL, and memory cell transistors MCT.

The bit and source lines BL and SL may be vertically extended in a third direction D3. The bit lines BL may include a plurality of pairs of bit lines, where each pair includes a first bit line BL1 and a second bit line BL2, which are adjacent to each other in a second direction D2. The source lines SL may include a plurality of pairs of source lines, where each pair includes first source line SL1 and a second source line SL2, which are adjacent to each other in the second direction D2.

The first bit lines BL1 and the first source lines SL1 may be alternately arranged in a first direction D1. The second bit lines BL2 and the second source lines SL2 may be alternately arranged in the first direction D1.

The word lines WL may be provided between the first and second bit lines BL1 and BL2, which are adjacent to each other, and between the first and second source lines SL1 and SL2, which are adjacent to each other, as illustrated in FIG. 1. The word line WL may be horizontally extended in the first direction D1. The word lines WL may be vertically stacked in the third direction D3.

The memory cell transistor MCT may be provided between the first source line SL1 and the first bit line BL1 adjacent thereto. The memory cell transistor MCT may include a source terminal and a drain terminal, which are respectively connected to the first source line SL1 and the first bit line BL1. A gate terminal of the memory cell transistor MCT may be connected to the word line WL. The memory cell transistor MCT may constitute a single memory cell MEC. In an embodiment, the memory cell MEC may be a unit cell of a ferroelectric random access memory (FeRAM) device.

The memory cell transistor MCT may be provided between the second source line SL2 and the second bit line BL2 adjacent thereto. The memory cell transistor MCT may include a source terminal and a drain terminal, which are respectively connected to the second source line SL2 and the second bit line BL2. A gate terminal of the memory cell transistor MCT may be connected to the word line WL.

A plurality of vertically-stacked memory cells MEC may be connected to the first source line SL1 and the first bit line BL1 to constitute one cell string CSTR. A plurality of vertically-stacked memory cells MEC may be connected to the second source line SL2 and the second bit line BL2 to constitute one cell string CSTR. The stacked word lines WL may be connected to the cell string CSTR.

The cell string CSTR may be a vertical string, which is extended in the third direction D3. The cell string CSTR may include the stacked memory cells MEC (e.g., first, second and third memory cells MEC1, MEC2, and MEC3 which are sequentially stacked). In detail, the first memory cell MEC1, which is connected to the first source line SL1 and the first bit line BL1, may be located at the same level as the first memory cell MEC1, which is connected to the second source line SL2 and the second bit line BL2. The first memory cell MEC1, which is connected to the first source line SL1 and the first bit line BL1, and the first memory cell MEC1, which is connected to the second source line SL2 and the second bit line BL2, may be connected in common to one of the word lines WL.

A plurality of the cell strings CSTR, each of which is connected to the first source line SL1 and the first bit line BL1, may be provided along the first source lines and the first bit lines SL1 and BL1. The cell strings CSTR may be arranged along the word line WL or in the first direction D1. A plurality of the cell strings CSTR, each of which is connected to the second source line SL2 and the second bit line BL2, may be provided along the second source lines and the second bit lines SL2 and BL2. The cell strings CSTR may be arranged along the word line WL or in the first direction D1.

As described above, the memory cells MEC according to some embodiments may be arranged not only in a two-dimensional manner but also in a three-dimensional manner. In other words, the memory device of FIG. 1 may be a three-dimensional semiconductor memory device, in which the memory cells MEC are three-dimensionally arranged.

Each of the memory cells MEC may be configured to store data using a polarization state of a ferroelectric material therein. The ferroelectric material in the memory cell MEC may be controlled to have one of various polarization states or may be configured to output an electric signal corresponding to each polarization state. For example, the ferroelectric material in the memory cell MEC may store or output data (e.g., binary data of '1' or '0') exhibiting logical states.

The ferroelectric material may be polarized by control signals, which are applied to the word line WL, the bit line BL, and the source line SL. In detail, the word line WL, the bit line BL, and the source line SL may be used to apply respective voltages to the ferroelectric material, and in this case, the polarization state of the ferroelectric material may vary depending on a direction of an electric field, which is induced in the ferroelectric material by the voltages. The data stored in the memory cell MEC may be determined by comparing a current, which is output from the bit line BL, with a reference current. The ferroelectric material may be maintained to a specific polarization state, even when an electric power is interrupted. That is, the three-dimensional semiconductor memory device in some embodiments may be a nonvolatile memory device.

Figure 2:
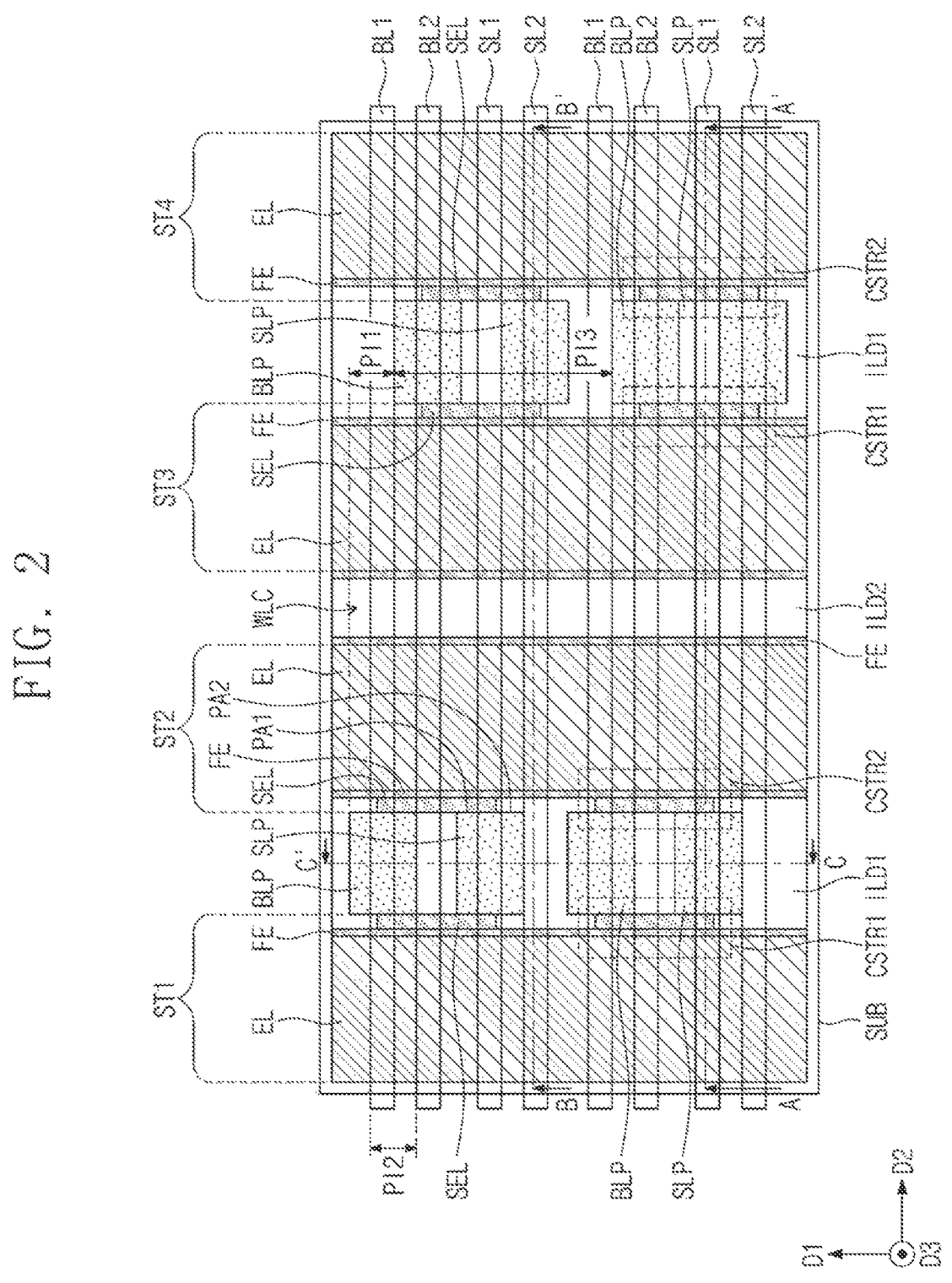
Figure 3A:
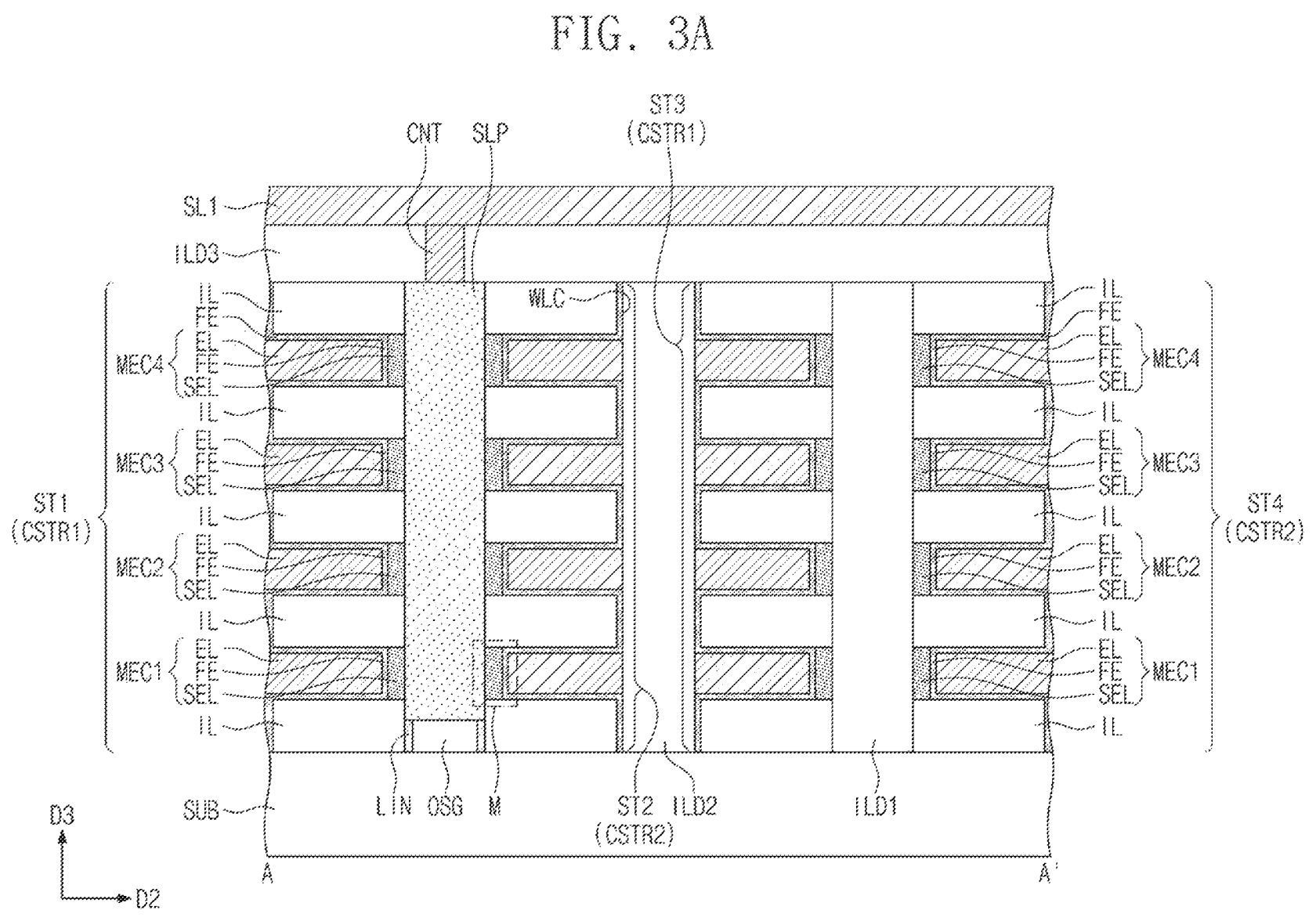
Figure 3B:
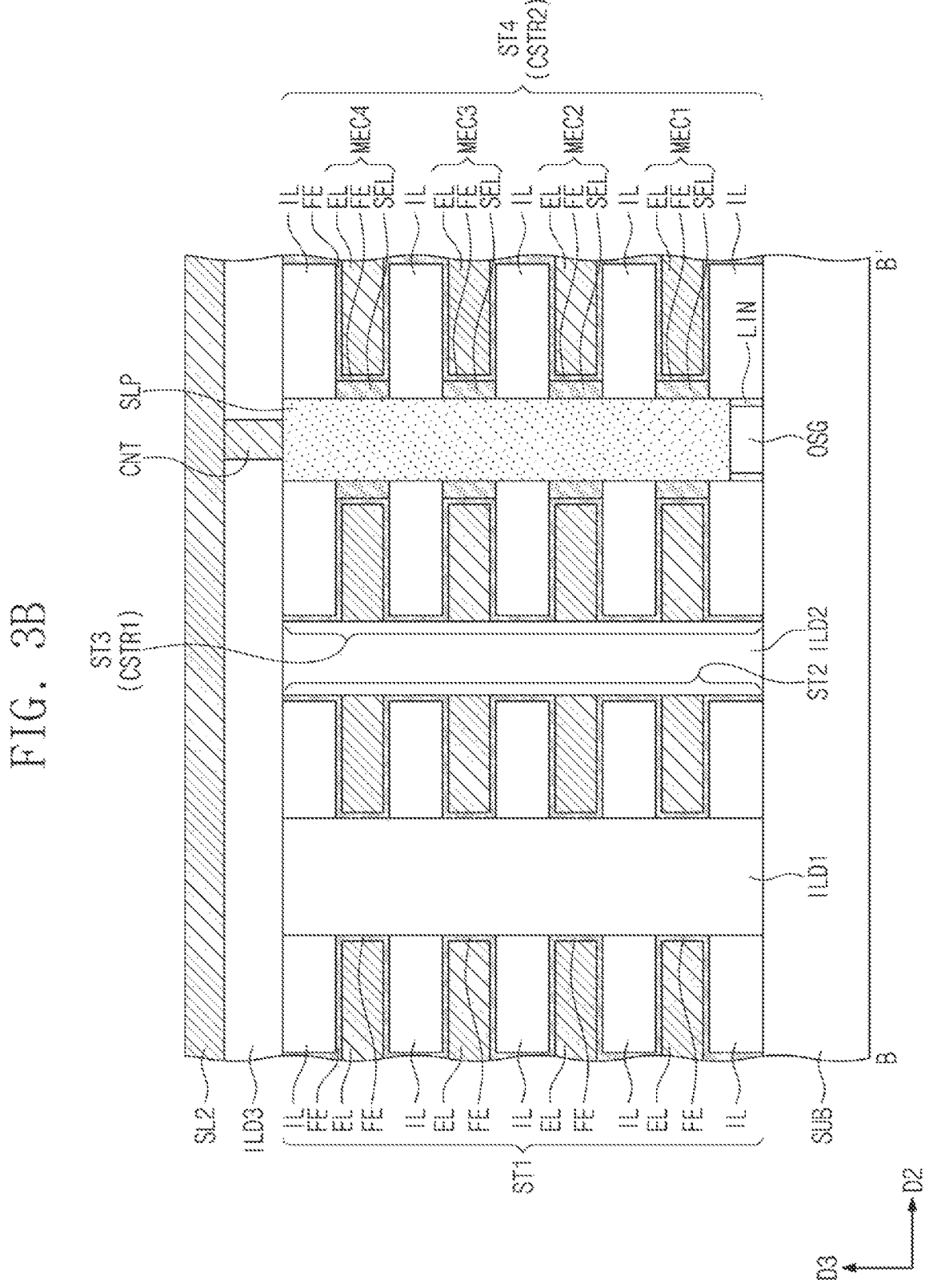
FIG. 3B is a sectional view taken along a line B-B' of FIG. 2.
Figure 3C:
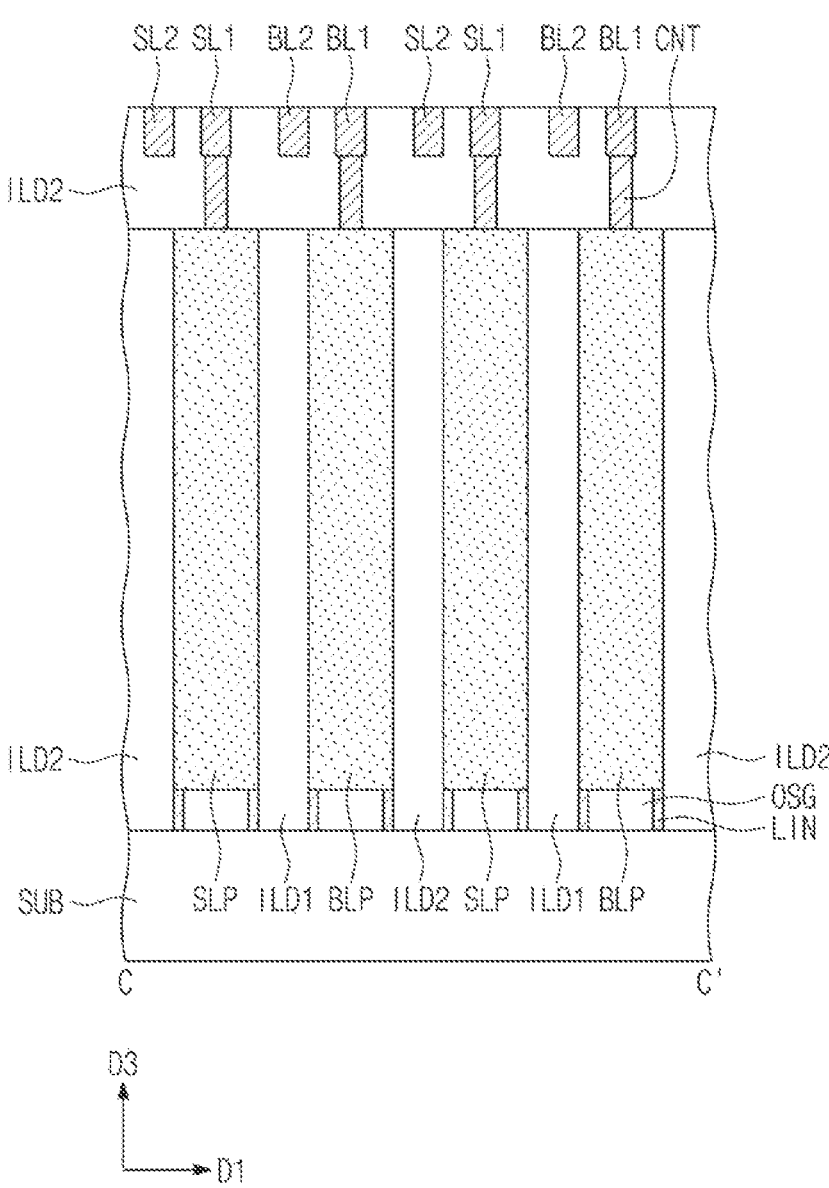
FIG. 3C is a sectional view taken along a line C-C' of FIG. 2.
Figure 4:
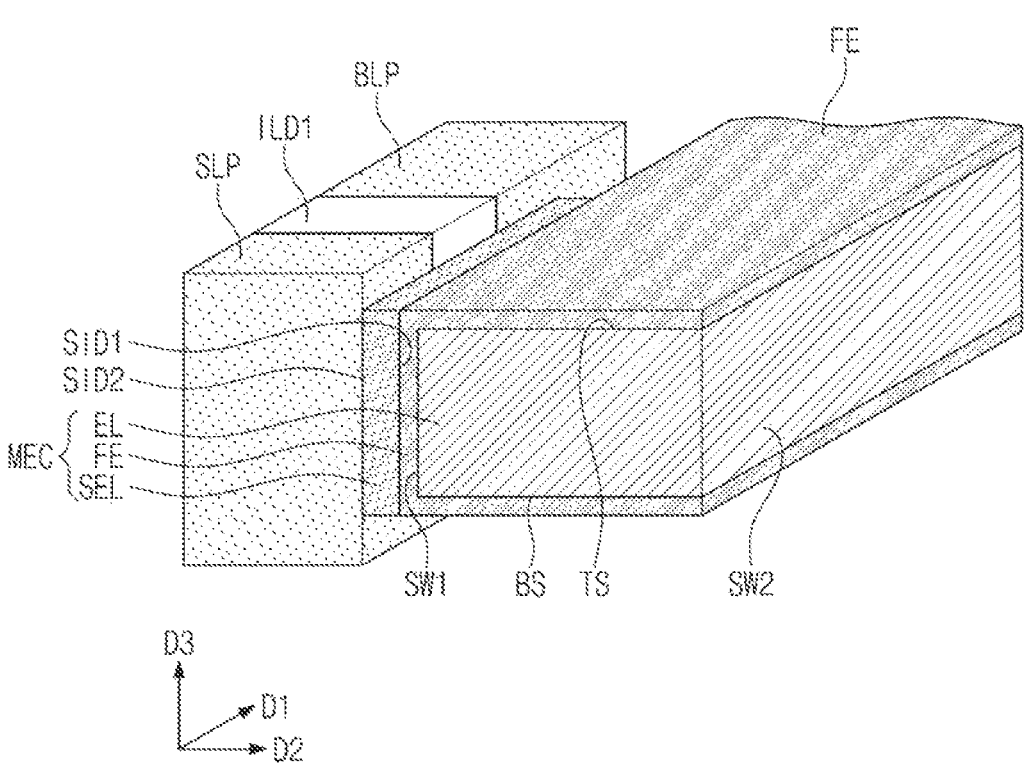
FIG. 4 is a perspective view illustrating a memory cell according to some embodiments.

FIG. 2 is a plan view illustrating a three-dimensional semiconductor memory device according to some embodiments. FIG. 3A is a sectional view taken along a line A-A' of FIG. 2. FIG. 3B is a sectional view taken along a line B-B' of FIG. 2. FIG. 3C is a sectional view taken along a line C-C' of FIG. 2. FIG. 4 is a perspective view illustrating a memory cell according to some embodiments.

Referring to FIGS. 2 and 3A to 3C, a first stack ST1, a second stack ST2, a third stack ST3, and a fourth stack ST4 may be provided on a substrate SUB. The substrate SUB may include a semiconductor substrate (e.g., a silicon substrate, a silicon-germanium substrate, a germanium substrate, and a single crystalline epitaxial layer grown on a single crystalline silicon substrate.

The first to fourth stacks ST1-ST4 may be disposed to be spaced apart from each other in the second direction D2. Each of the first to fourth stacks ST1-ST4 may be extended in the first direction D1. When viewed in a plan view, each of the first to fourth stacks ST1-ST4 may be a line-shaped pattern extended in the first direction D1. In an embodiment, each of the first to fourth stacks ST1-ST4 may be provided to have a substantially constant linewidth.

Each of the first to fourth stacks ST1-ST4 may include a plurality of electrodes EL and a plurality of insulating layers IL, which are alternately stacked (see FIGS. 3A-3B). The insulating layer IL may be interposed between vertically adjacent ones of the electrodes EL. In some embodiments, the stacked electrodes EL may correspond to the stacked word lines WL of FIG. 1.

In an embodiment, the electrodes EL may be formed of or include at least one of doped semiconductor materials (e.g., doped silicon and doped germanium), conductive metal nitrides (e.g., titanium nitride and tantalum nitride), metals (e.g., tungsten, titanium, and tantalum), or metal-semiconductor compounds (e.g., tungsten silicide, cobalt silicide, and titanium silicide). The insulating layers IL may be formed of or include at least one of silicon oxide, silicon nitride, or silicon oxynitride.

Each of the first to fourth stacks ST1-ST4 may include a plurality of channel layers SEL, which are coupled to the electrodes EL, respectively. The channel layers SEL may be stacked to be spaced apart from each other. The stacked channel layers SEL may be vertically overlapped with each other in the third direction D3. Each of the first to fourth stacks ST1-ST4 may further include a ferroelectric layer FE, which is interposed between the electrodes EL and the channel layers SEL.

A plurality of first conductive pillars SLP and a plurality of second conductive pillars BLP may be provided between the first and second stacks ST1 and ST2 (see FIG. 2). In a region between the first and second stacks ST1 and ST2, the first conductive pillars SLP and the second conductive pillars BLP may be alternately arranged in the first direction D1. The first and second conductive pillars SLP and BLP, which are alternately arranged between the first and second stacks ST1 and ST2, may correspond to the first source lines SL1 and the first bit lines BL1, respectively, described with reference to FIG. 1.

The first and second conductive pillars SLP and BLP may be provided between the third and fourth stacks ST3 and ST4. In a region between the third and fourth stacks ST3 and ST4, the first conductive pillars SLP and the second conductive pillars BLP may be alternately arranged in the first direction D1. The first and second conductive pillars SLP and BLP, which are alternately arranged between the third and fourth stacks ST3 and ST4, may correspond to the second source lines SL2 and the second bit lines BL2, respectively, in the embodiment of FIG. 1.

The first and second conductive pillars SLP and BLP may be formed of or include at least one selected from the group consisting of doped semiconductor materials, conductive metal nitrides, metals, and metal-semiconductor compounds.

Each of the first and second conductive pillars SLP and BLP may be a pillar-shaped pattern extended in the third direction D3. The first and second conductive pillars SLP and BLP, which are adjacent to each other, may be spaced apart from each other, in the first direction D1, with a first interlayer insulating layer ILD1 interposed therebetween. The first and second conductive pillars SLP and BLP may be interposed between the channel layer SEL of the first stack ST1 and the channel layer SEL of the second stack ST2. The first and second conductive pillars SLP and BLP may be interposed between the channel layer SEL of the third stack ST3 and the channel layer SEL of the fourth stack ST4.

In an embodiment, the conductive pillars SLP and BLP between the first and second stacks ST1 and ST2 may be slightly offset (or misaligned) in the first direction D1 from the conductive pillars SLP and BLP, which are disposed adjacent thereto in the second direction D2 and between the third and fourth stacks ST3 and ST4. This configuration may make it possible to connect the conductive pillar SLP or BLP between the first and second stacks ST1 and ST2 to the first bit and source lines BL1 and SL1 and to connect the conductive pillar SLP or BLP between the third and fourth stacks ST3 and ST4 to the second bit and source lines BL2 and SL2, as will be described below.

When viewed in the plan view of FIG. 2, the channel layer SEL may be a line- or bar-shaped pattern, which is extended from the first conductive pillar SLP to the second conductive pillar BLP via the first interlayer insulating layer ILD1. The channel layer SEL may be provided to connect the first and second conductive pillars SLP and BLP to each other.

Referring to FIGS. 3A, 3B, and 4, the ferroelectric layer FE may directly cover a surface of the electrode EL. In detail, the ferroelectric layer FE may cover a bottom surface BS, a first side surface SW1, and a top surface TS of the electrode EL. The ferroelectric layer FE may be provided to expose a second side surface SW2 of the electrode EL. The second side surface SW2 may be a surface that is opposite to the first side surface SW1 of the electrode EL in the second direction D2.

The ferroelectric layer FE may directly cover a side surface SID1 of each of the stacked channel layers SEL. An opposite side surface SID2 of each of the stacked channel layers SEL may be connected to the conductive pillar SLP and BLP. More specifically, opposite side surface SID2 of the channel layer SEL may be extended from the first conductive pillar SLP to the second conductive pillar BLP via the first interlayer insulating layer ILD1 (e.g., see FIG. 4).

Referring back to FIGS. 2 and 3A to 3C, the first stack ST1 may include first to fourth memory cells MEC1-MEC4, which are sequentially stacked. The first to fourth memory cells MEC1-MEC4 may be interposed between the first stack ST1 and the first and second conductive pillars SLP and BLP. The first to fourth memory cells MEC1-MEC4, which are sequentially stacked in the first stack ST1, may constitute a first cell string CSTR1.

The second stack ST2 may include the first to fourth memory cells MEC1-MEC4, which are sequentially stacked. The first to fourth memory cells MEC1-MEC4 may be interposed between the second stack ST2 and the first and second conductive pillars SLP and BLP. The first to fourth memory cells MEC1-MEC4, which are sequentially stacked in the second stack ST2, may constitute a second cell string CSTR2.

The third stack ST3 may include the first cell string CSTR1, which is composed of the stacked first to fourth memory cells MEC1-MEC4. The fourth stack ST4 may include the second cell string CSTR2, which is composed of the stacked first to fourth memory cells MEC1-MEC4.

In an embodiment, each of the first to fourth memory cells MEC1-MEC4 (i.e., a unit cell) may include the electrode EL, the channel layer SEL, and the ferroelectric layer FE. The electrode EL, the channel layer SEL, and the ferroelectric layer FE of the unit cell may constitute the memory cell transistor MCT described with reference to FIG. 1. The memory cell transistor MCT of some embodiments may include a thin film transistor. The unit cell of some embodiments may be a 1-transistor (1T) memory cell.

The channel layer SEL may be provided to connect the first conductive pillar SLP and the second conductive pillar BLP to each other. In other words, the first and second conductive pillars SLP and BLP, which are spaced apart from each other by the first interlayer insulating layer ILD1, may be electrically connected to each other by the channel layer SEL. The channel layer SEL may serve as a body of the memory cell transistor. The channel layer SEL may include a source region connected to the first conductive pillar SLP, a drain region connected to the second conductive pillar BLP, and a channel region between the source and drain regions.

The channel layer SEL may be formed of or include at least one of a semiconductor material, an amorphous oxide semiconductor material, or a two-dimensional material. The semiconductor material may be formed of or include crystalline silicon or crystalline silicon germanium (SiGe). The amorphous oxide semiconductor material may include at least one selected from the group consisting of indium gallium zinc oxide (IGZO), indium tin zinc oxide (ITZO), Sn-IGZO, IWO, $CuS_2$, $CuSe_2$, $WSe_2$, IZO, ZTO, and YZO. The two-dimensional material may include at least one selected from the group consisting of graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $WO_3$, and $MoO_3$.

In an embodiment, the channel layer SEL may be formed of or include a single crystalline semiconductor material. For example, the channel layer SEL may be formed of or include single crystalline silicon. The channel layers SEL, which are stacked to be spaced apart from each other, may be single crystalline silicon channels, which are split to be spaced apart from each other.

The ferroelectric layer FE may be interposed between the channel layer SEL and the electrode EL. The ferroelectric layer FE may be conformally formed to have a profile corresponding to the electrode EL. The ferroelectric layer FE may be configured to have various polarization states, depending on a difference between voltages, which are respectively applied to the first and second conductive pillars SLP and BLP and the electrode EL. In some embodiments, a thickness of the channel layer SEL may be larger than a thickness of the ferroelectric layer FE. As an example, the thickness of the ferroelectric layer FE may range from 5 nm to 20 nm.

The ferroelectric layer FE may be formed of or include a ferroelectric material. The ferroelectric layer FE may be formed of or include a hafnium compound (i.e., Hf-based oxide) having a ferroelectric property. The Hf-based oxide having the ferroelectric property may further contain at least one impurity selected from the group consisting of Zr, Si, Al, Y, Gd, La, Sc, and Sr. For example, the ferroelectric layer FE may be formed of or include at least one of $HfO_2$, HfZnO, HfSiO, HfSiON, HfTaO, HfTiO, HfZrO, or combinations thereof. The ferroelectric layer FE may have an orthorhombic phase. The ferroelectric layer FE may include a single ferroelectric layer or may have a multi-layered structure, in which at least two different ferroelectric layers are stacked, or in which a ferroelectric layer and a dielectric layer are stacked.

The first interlayer insulating layer ILD1 may be provided between the channel layers SEL, which are adjacent to each other in the first direction D1. The first interlayer insulating layer ILD1 may separate a group of the first and second cell strings CSTR1 and CSTR2 from another group, which is composed of the first and second cell strings CSTR1 and CSTR2 and is adjacent thereto in the first direction D1.

In an embodiment, referring to FIG. 2, a first portion PA1 of a side surface of the first conductive pillar SLP may be in contact with the channel layer SEL. A remaining or second portion PA2 of the side surface of the first conductive pillar SLP may be in contact with the first interlayer insulating layer ILD1. A first portion of a side surface of the second conductive pillar BLP may be in contact with the channel layer SEL. A remaining or second portion of the side surface of the second conductive pillar BLP may be in contact with the first interlayer insulating layer ILD1.

An insulating pattern OSG may be provided between each of the first and second conductive pillars SLP and BLP and the substrate SUB. The insulating pattern OSG may separate the conductive pillar SLP or BLP from the substrate SUB. The insulating pattern OSG may include at least one of a silicon oxide layer, a silicon nitride layer, or a silicon oxynitride layer. For example, the insulating pattern OSG may be formed by oxidizing a semiconductor layer which is epitaxially grown from the substrate SUB. A liner layer LIN may be interposed between the insulating pattern OSG and the lowermost one of the insulating layers IL.

A cut region WLC may be defined between the second and third stacks ST2 and ST3. The cut region WLC may be a trench-shaped empty space, which is formed to separate the second and third stacks ST2 and ST3 from each other. An inner space of the cut region WLC may be filled with a second interlayer insulating layer ILD2. The uppermost surface of the ferroelectric layer FE may be exposed through the cut region WLC.

In an embodiment, the first and second conductive pillars SLP and BLP may have top surfaces that are substantially coplanar with a top surface of the uppermost insulating layer IL in the stacks ST1-ST4. The uppermost surface of the ferroelectric layer FE may be substantially coplanar with the top surface of the uppermost insulating layer IL in the stacks ST1-ST4.

A third interlayer insulating layer ILD3 may be provided on the first to fourth stacks ST1-ST4. A plurality of interconnection lines, which are extended in the second direction D2 and parallel to each other, may be provided on the third interlayer insulating layer ILD3. The interconnection lines may include the first and second bit lines BL1 and BL2 and the first and second source lines SL1 and SL2.

The first and second source lines SL1 and SL2 may be adjacent to each other in the first direction D1. The first source line SL1 may be electrically connected to the first conductive pillar SLP between the first and second stacks ST1 and ST2. The second source line SL2 may be electrically connected to the first conductive pillar SLP between the third and fourth stacks ST3 and ST4.

The first and second bit lines BL1 and BL2 may be adjacent to each other in the first direction D1. The first bit line BL1 may be electrically connected to the second conductive pillar BLP between the first and second stacks ST1 and ST2. The second bit line BL2 may be electrically connected to the second conductive pillar BLP between the third and fourth stacks ST3 and ST4.

The first and second source lines SL1 and SL2 may be respectively connected to the first conductive pillars SLP through contacts CNT. The first and second bit lines BL1 and BL2 may be respectively connected to the second conductive pillars BLP through the contacts CNT.

Referring back to FIG. 2, the conductive pillar SLP or BLP between the first and second stacks ST1 and ST2 may be offset from the conductive pillar SLP or BLP, which are disposed adjacent thereto and between the third and fourth stacks ST3 and ST4, by a first pitch PH in the first direction D1. A pitch between the first and second source lines SL1 and SL2, which are adjacent to each other, may be a second pitch PI2. A pitch between the first and second bit lines BL1 and BL2, which are adjacent to each other, may be the second pitch PI2. In some embodiments, the first pitch PH may be substantially equal to the second pitch PI2. As an example, a distance between the second conductive pillars BLP, which are placed between the third and fourth stacks ST3 and ST4, may be a third pitch PI3. The first pitch PH may be smaller than half of the third pitch PI3; that is, PI1<PI3/2.

The second cell string CSTR2 between the second stack ST2 and the first and second conductive pillars SLP and BLP may be offset from the first cell string CSTR1 between the third stack ST3 and the first and second conductive pillars SLP and BLP by the first pitch PI1 in the first direction D1. In other words, the first and second cell strings CSTR1 and CSTR2, which are placed at both sides of the cut region WLC, may be slightly offset from each other in the first direction D1.

In the three-dimensional semiconductor memory device according to some embodiments, the channel layer SEL, which is formed of a single crystalline semiconductor material, may be used to connect the first and second conductive pillars SLP and BLP which are adjacent to each other. By using the single crystalline semiconductor material, it may be possible to increase the carrier mobility of the semiconductor device and to improve the electrical characteristics of the semiconductor device.

In the three-dimensional semiconductor memory device according to some embodiments, vertically adjacent ones of the channel layers SEL may be separated or disconnected from each other. Accordingly, it may be possible to reduce a leakage current between vertically adjacent ones of the memory cells MEC.

In the three-dimensional semiconductor memory device according to some embodiments, the electrode EL, which is extended in the first direction D1 to have a line shape with a substantially constant linewidth, may be used to connect cell strings, which are arranged in the first direction D1, to each other. That is, the electrode EL may be provided to have a uniformly large linewidth, and thus, an electric resistance of the electrode EL may be reduced. As a result, the electrical characteristics of the semiconductor device may be improved.

Figure 5A:
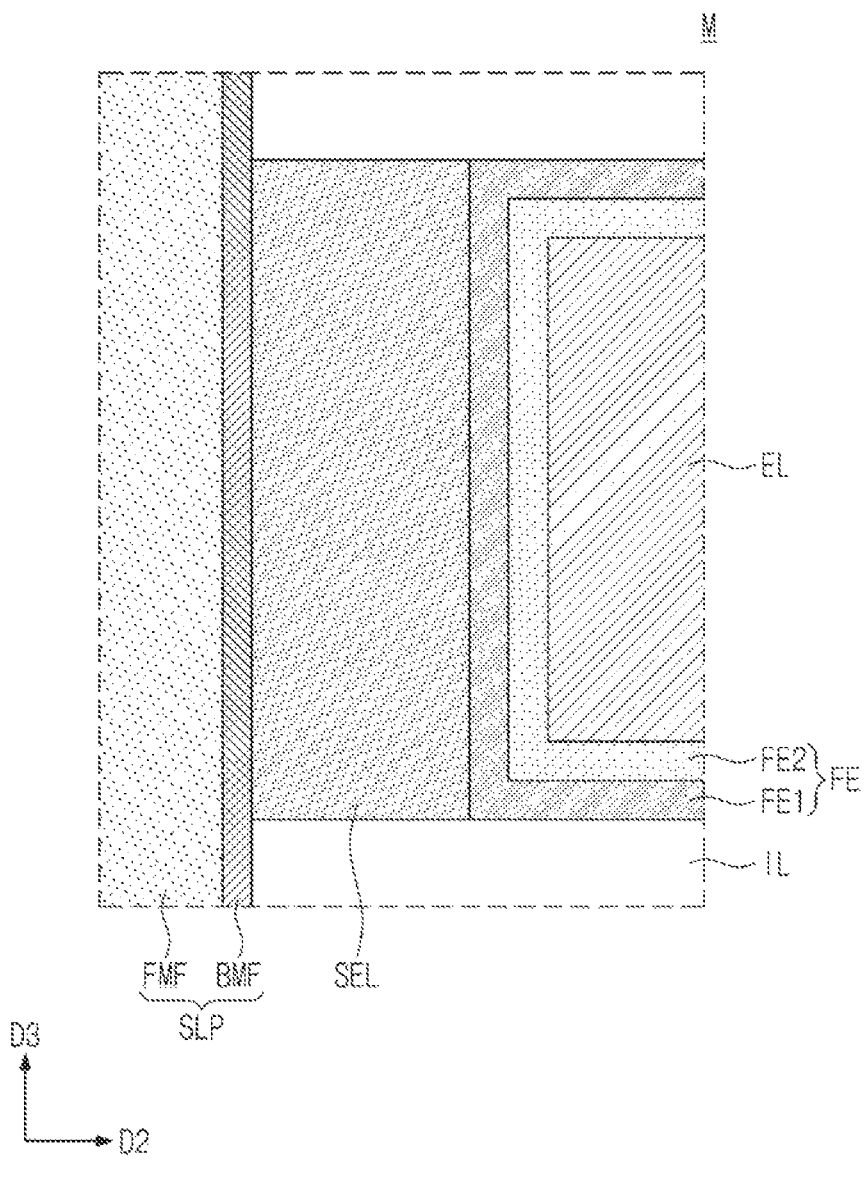
FIGS. 5A and 5B are enlarged sectional views, each of which illustrates a portion (e.g., 'M' of FIG. 3A) of a three-dimensional semiconductor memory device according to some embodiments.
Figure 5B:
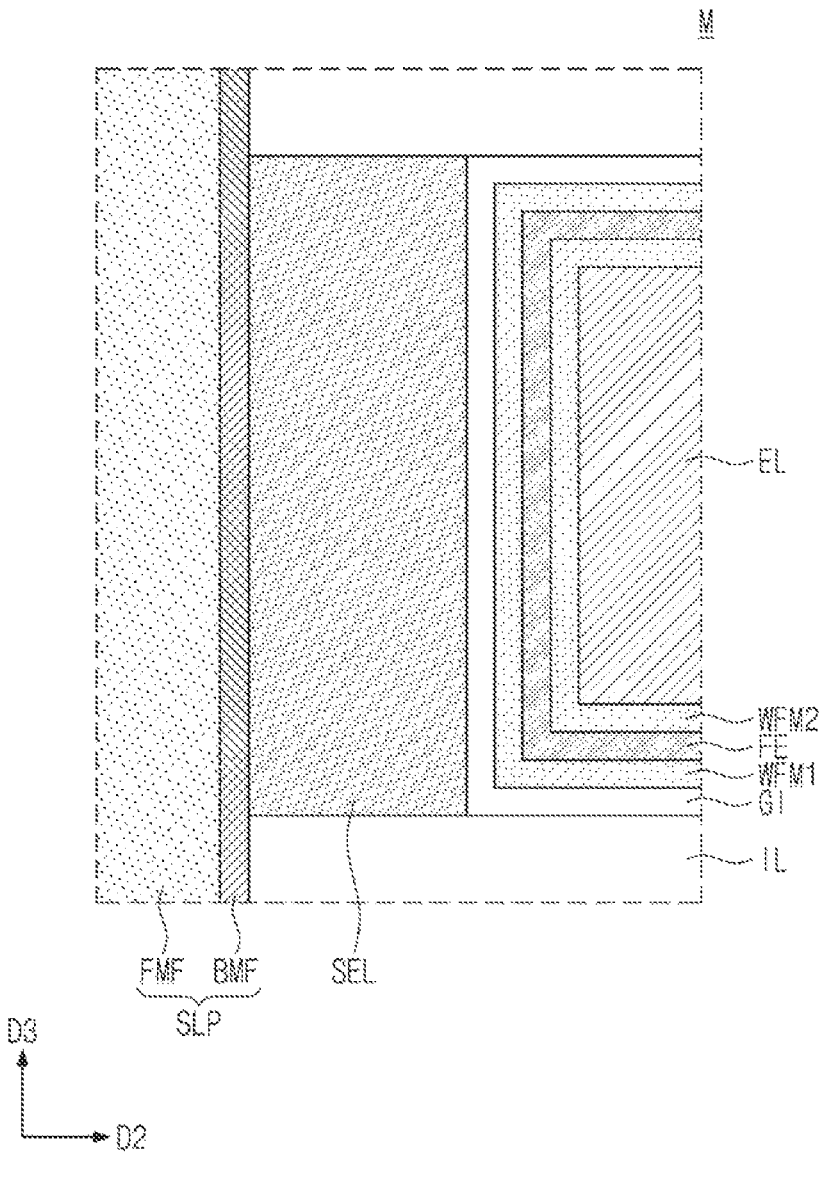

FIGS. 5A and 5B are enlarged sectional views, each of which illustrates a portion (e.g., 'M' of FIG. 3A) of a three-dimensional semiconductor memory device according to some embodiments. Referring to FIGS. 3A and 5A, the memory cell MEC1-MEC4 may include the conductive pillar SLP or BLP, the ferroelectric layer FE, the channel layer SEL, and the electrode EL. The ferroelectric layer FE and the channel layer SEL may be interposed between the conductive pillar SLP or BLP and the electrode EL. That is, the ferroelectric layer FE and the channel layer SEL may be interposed between the conductive pillar SLP and the electrode EL, and the ferroelectric layer FE and the channel layer SEL may be interposed between the conductive pillar BLP and the electrode EL.

The conductive pillar SLP or BLP may include a filling metal FMF and a barrier metal BMF. The barrier metal BMF may be interposed between the filling metal FMF and the channel layer SEL. The filling metal FMF may be formed of or include at least one of low resistance metals (e.g., tungsten, titanium, and tantalum), and the barrier metal BMF may be formed of or include at least one of conductive metal nitrides (e.g., titanium nitride and tantalum nitride).

In the case where the channel layer SEL includes a semiconductor material (e.g., single crystalline silicon), a metal-silicide layer may be further provided between the barrier metal BMF and the channel layer SEL.

As described above, in some embodiments, the ferroelectric layer FE may be a single ferroelectric layer. In some embodiments, the ferroelectric layer FE may have a multi-layered structure, in which at least two layers are stacked, as illustrated in FIG. 5A. For example, the ferroelectric layer FE may include a first layer FE1 and a second layer FE2.

In some embodiments, both the first and second layers FE1 and FE2 may be formed of or include a ferroelectric material. In some embodiments, one of the first and second layers FE1 and FE2 may be formed of or include a ferroelectric material, and the other may be formed of or include a paraelectric material. The paraelectric material may be formed of or include at least one of silicon oxide or high-k dielectric metal oxides. For example, the paraelectric material may be formed of or include at least one of hafnium oxide, zirconium oxide, or aluminum oxide, but the inventive concept is not limited to this example.

In some embodiments, the first and second layers FE1 and FE2 may be formed of or include the same material. Nevertheless, the first layer FE1 may be provided to have a ferroelectric property, whereas the second layer FE2 may not have the ferroelectric property. For example, in the case where both the first and second layers FE1 and FE2 include hafnium oxide, the hafnium oxide in the first layer FE1 may be formed to have a crystal structure that is different from a crystal structure of the hafnium oxide in the second layer FE2. The first layer FE1 may be formed to have a thickness, at which the ferroelectric property is exhibited. In an embodiment, such a thickness of the first layer FE1 may range from 0.5 nm to 10 nm, but the thickness of the first layer FE1 is not limited to this range. Since a critical thickness associated with the occurrence of the ferroelectric property varies depending on the kind of the ferroelectric material, the thickness of the ferroelectric layer may be changed depending on the kind of the ferroelectric material.

In some embodiments, the first and second layers FE1 and FE2 may be formed of or include different materials from each other. As an example, the first layer FE1 may be formed of or include hafnium oxide, and the second layer FE2 may be formed of or include aluminum oxide.

In some embodiments, the first and second layers FE1 and FE2 may be provided in plural and may be alternatingly stacked. The alternatingly-stacked first and second layers FE1 and FE2 may constitute one ferroelectric layer FE.

Referring to FIGS. 3A and 5B, the memory cell MEC1-MEC4 may include a gate insulating layer GI, a first metal pattern WFM1, the ferroelectric layer FE, a second metal pattern WFM2, and the electrode EL, which are sequentially stacked on the channel layer SEL. In some embodiments, a ferroelectric field effect transistor (FeFET) may include a metal-ferroelectric-metal (MFM) structure, which is composed of the first metal pattern WFM1, the ferroelectric layer FE, and the second metal pattern WFM2.

For example, the gate insulating layer GI may be formed of or include at least one of silicon oxide and/or high-k dielectric materials. Each of the first and second metal patterns WFM1 and WFM2 may be formed of or include at least one of conductive metal nitrides and/or metals. For example, each of the first and second metal patterns WFM1 and WFM2 may be formed of or include titanium nitride.

Figure 15A:
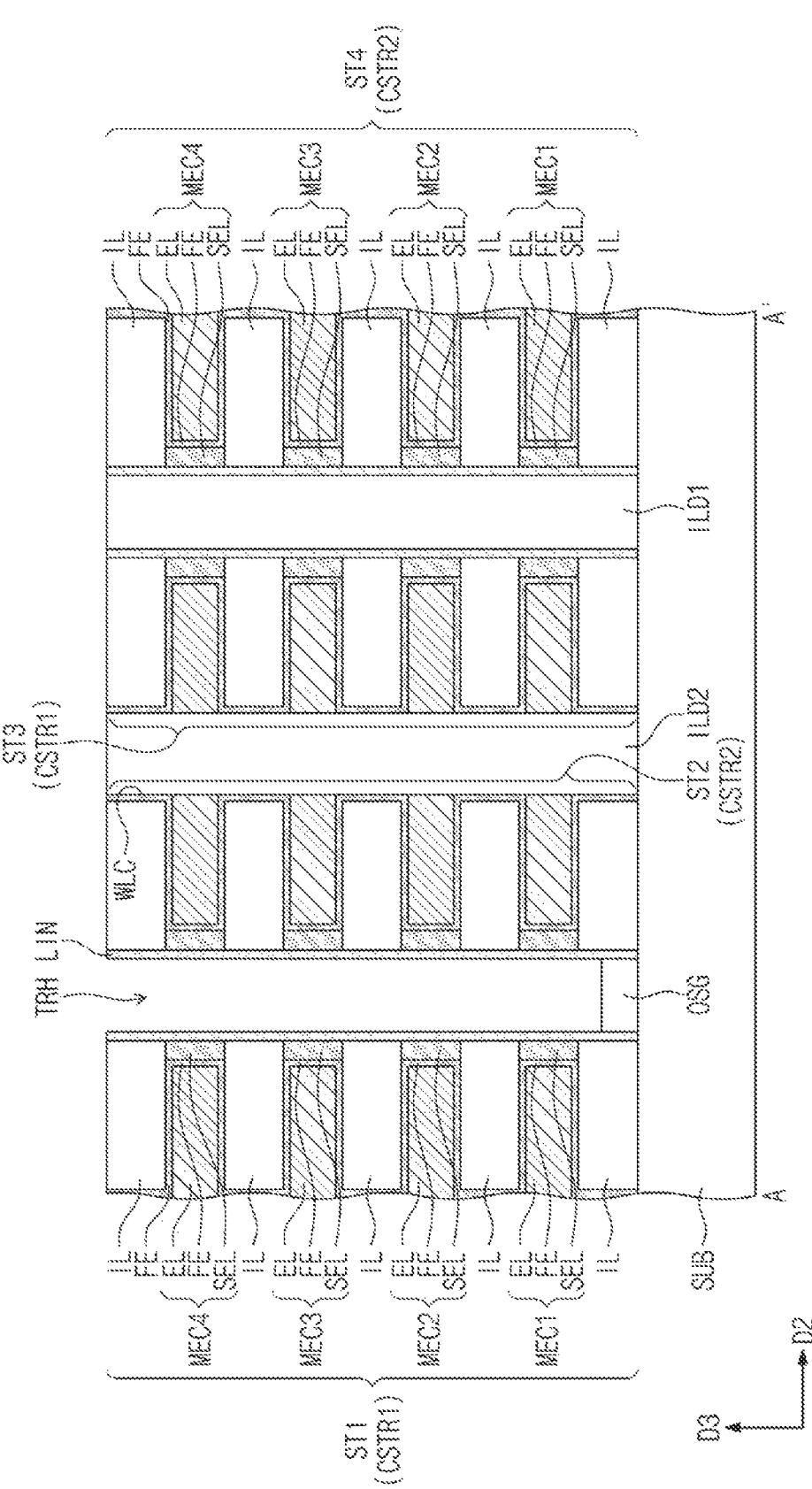
Figure 15C:
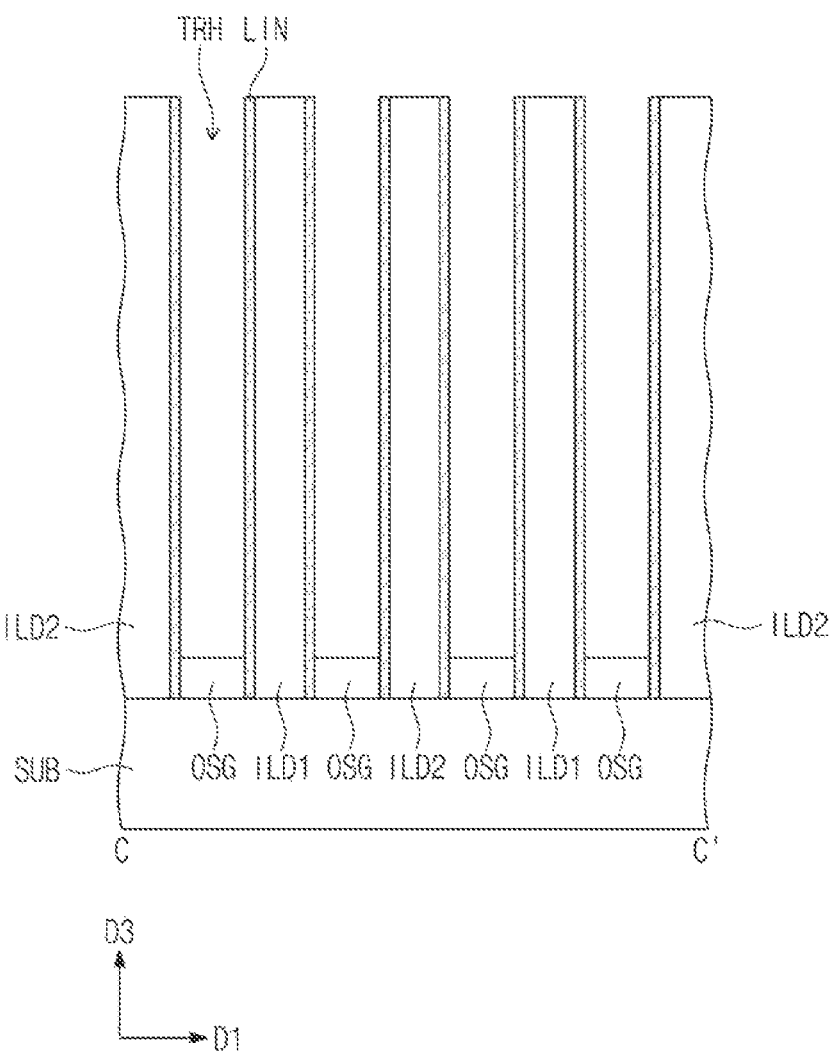
FIGS. 15C and 17C are sectional views, each of which is taken along a line C-C' of FIG. 16.
Figure 17A:
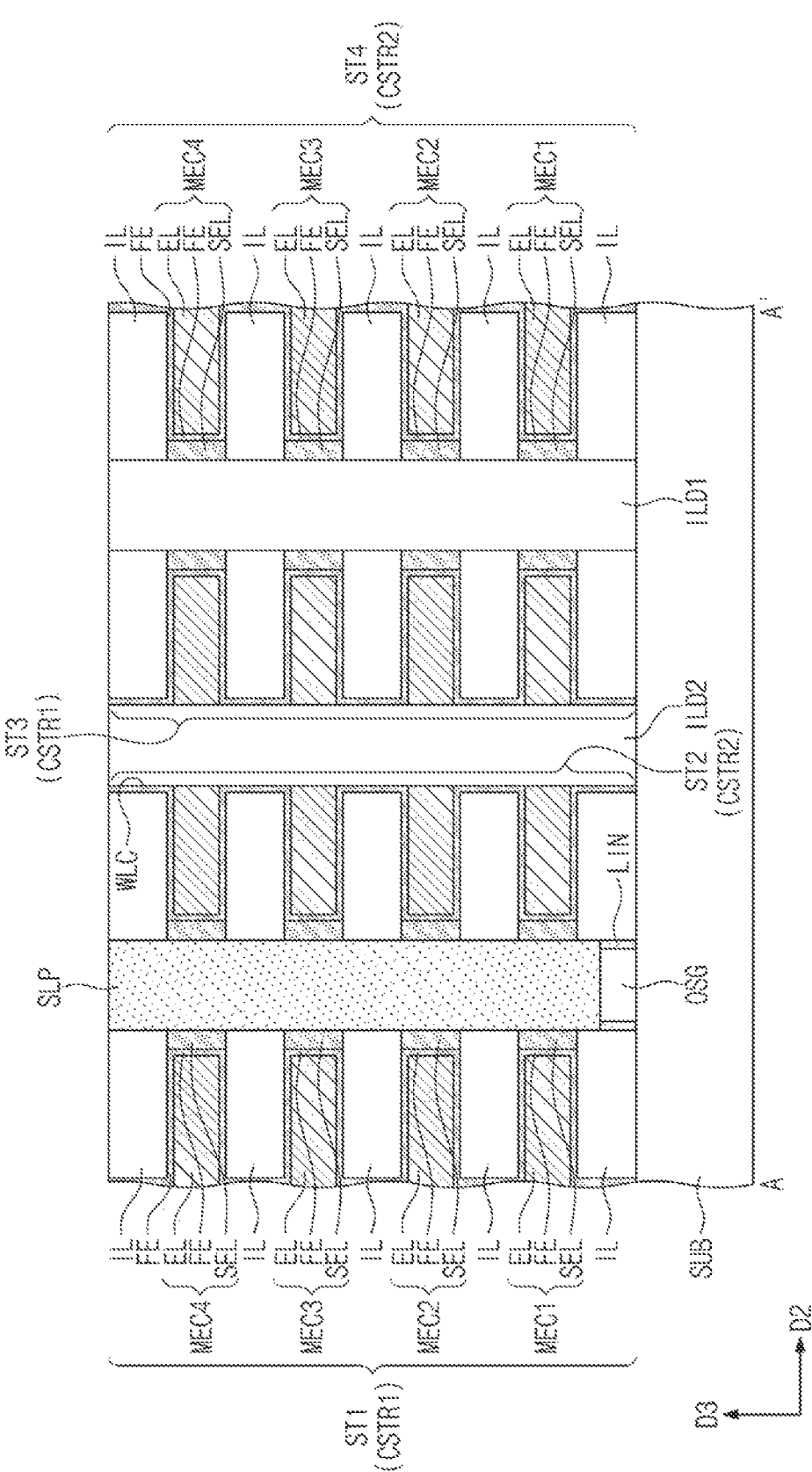
Figure 17C:
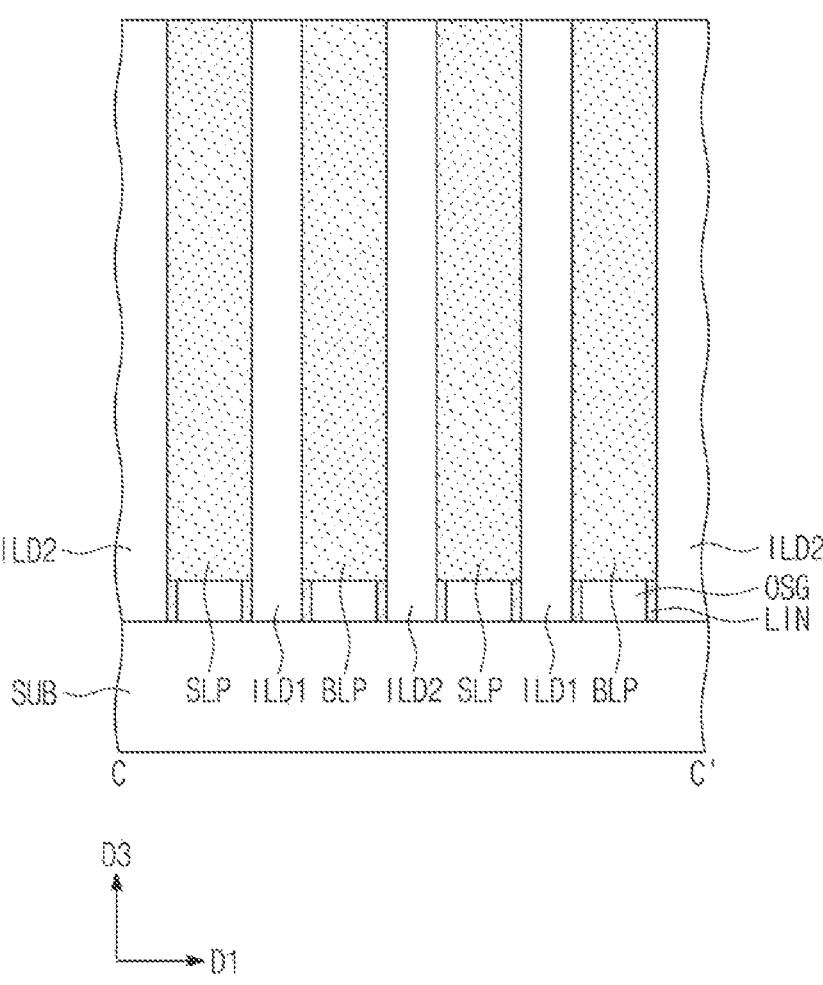

FIGS. 6, 8, 10, 12, 14, and 16 are plan views illustrating a method of fabricating a three-dimensional semiconductor memory device, according to some embodiments. FIGS. 7, 9, 11A, 13A, 15A, and 17A are sectional views taken along lines A-A' of FIGS. 6, 8, 10, 12, 14, and 16, respectively. FIGS. 11B, 13B, 15B, and 17B are sectional views taken along lines B-B' of FIGS. 10, 12, 14, and 16, respectively. FIGS. 15C and 17C are sectional views, each of which is taken along a line C-C' of FIG. 16.

Figure 6:
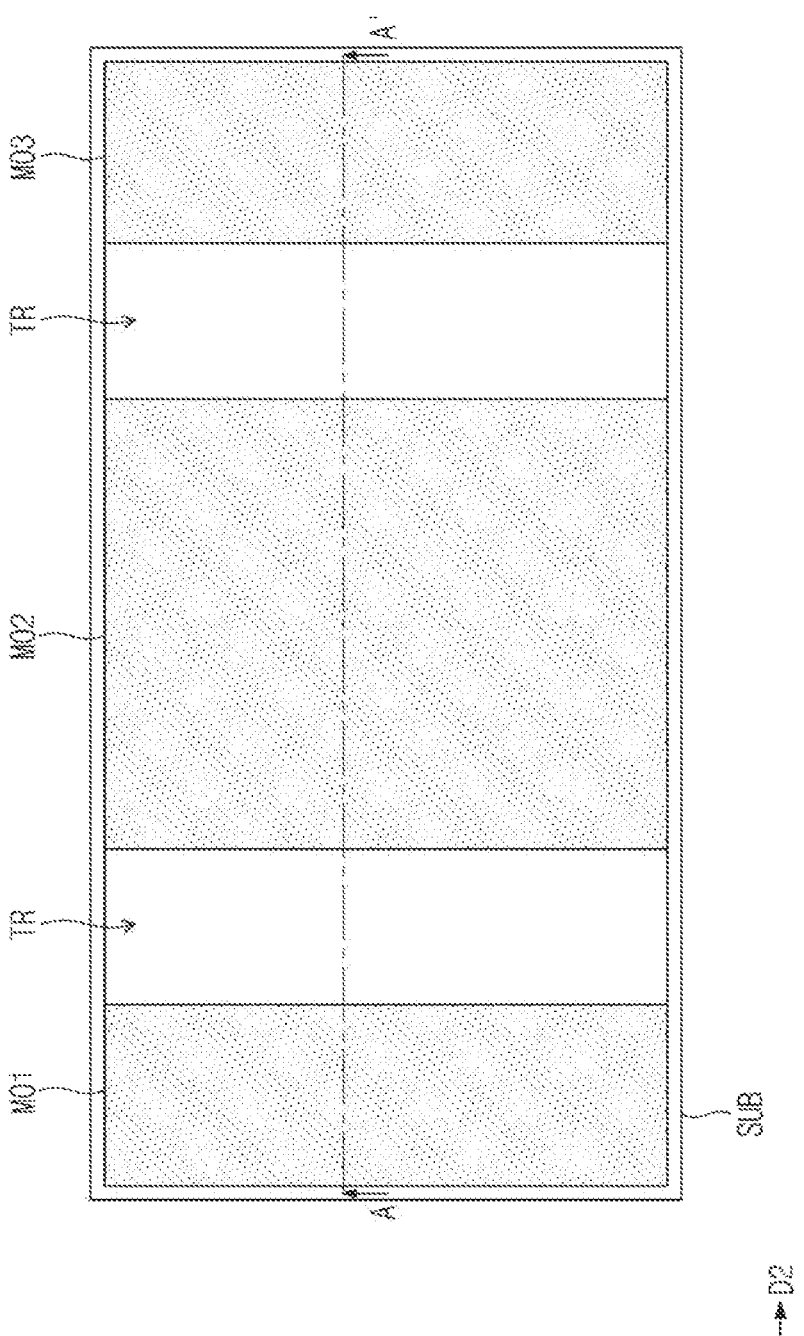
Figure 7:
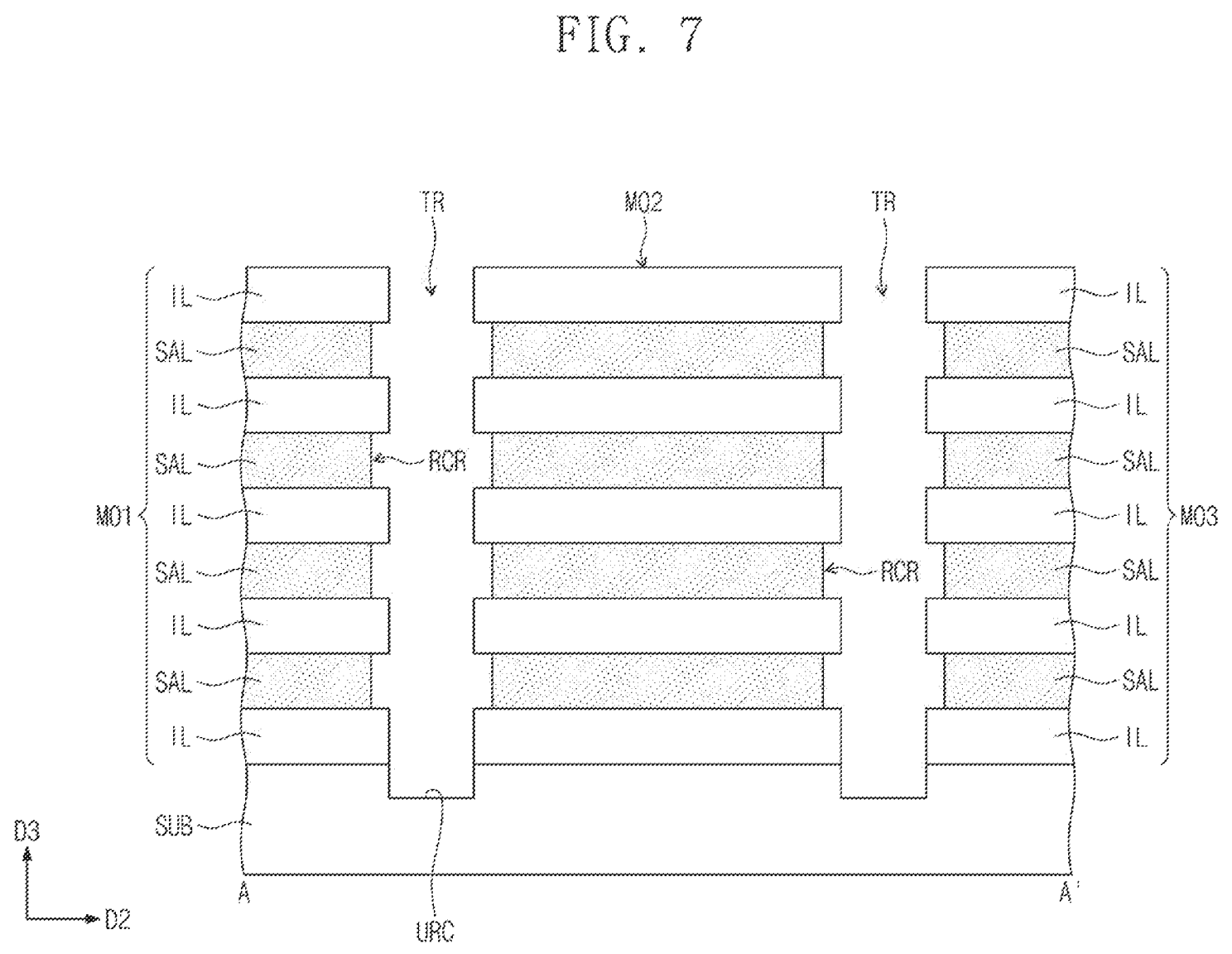

Referring to FIGS. 6 and 7, a mold structure may be formed on the substrate SUB. The formation of the mold structure may include alternately stacking the insulating layers IL and sacrificial layers SAL on the substrate SUB. The insulating layers IL may be formed of or include a silicon-based insulating material. The sacrificial layers SAL may be formed of or include an insulating material having an etch selectivity with respect to the insulating layers IL. The sacrificial layers SAL may include at least one of a silicon oxide layer, a silicon nitride layer, or a silicon oxynitride layer. For example, the sacrificial layers SAL may be formed of a silicon nitride layer.

A plurality of mold structures MO1 to MO3, which are extended in the first direction D1, may be formed by patterning the mold structure. The mold structures MO1 to MO3 may include a first mold structure MO1, a second mold structure MO2, and a third mold structure MO3, which are sequentially arranged in the second direction D2.

The formation of the first to third mold structures MO1 to MO3 may include anisotropically etching the mold structure MO to form trenches TR penetrating the mold structure MO. Each of the trenches TR may have a line-shaped region extended in the first direction D1. The trenches TR may be formed to expose the substrate SUB.

An upper portion of the substrate SUB may be over-etched by the anisotropic etching process of forming the trenches TR. Accordingly, an upper recess URC may be formed in the upper portion of the substrate SUB.

Recess regions RCR may be formed by partially etching the sacrificial layers SAL exposed by the trench TR. The partial etching of the sacrificial layers SAL may include performing a selective wet etching process on the sacrificial layers SAL. Each of the recess regions RCR may be formed between vertically adjacent ones of the insulating layers IL.

Figure 8:
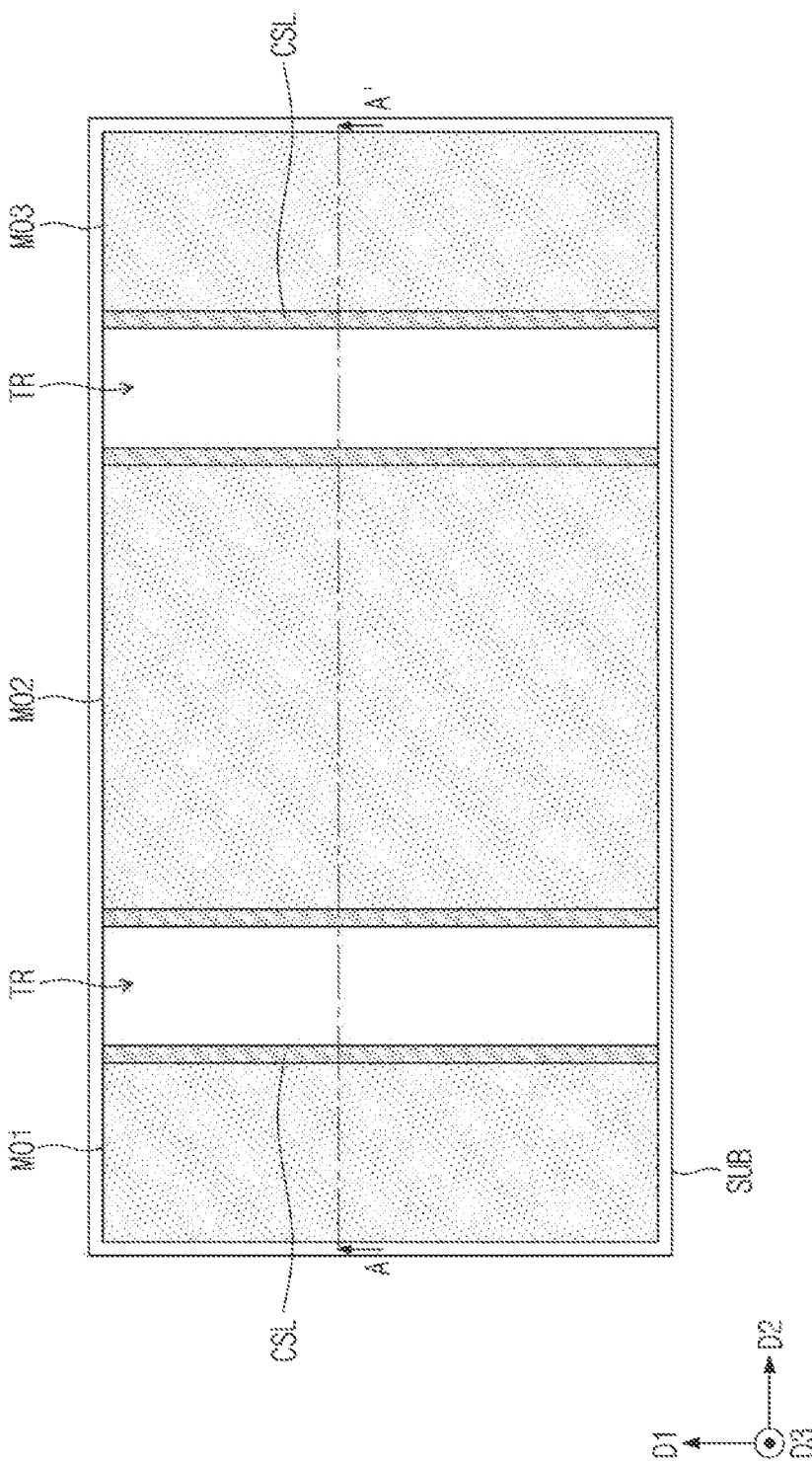
Figure 9:
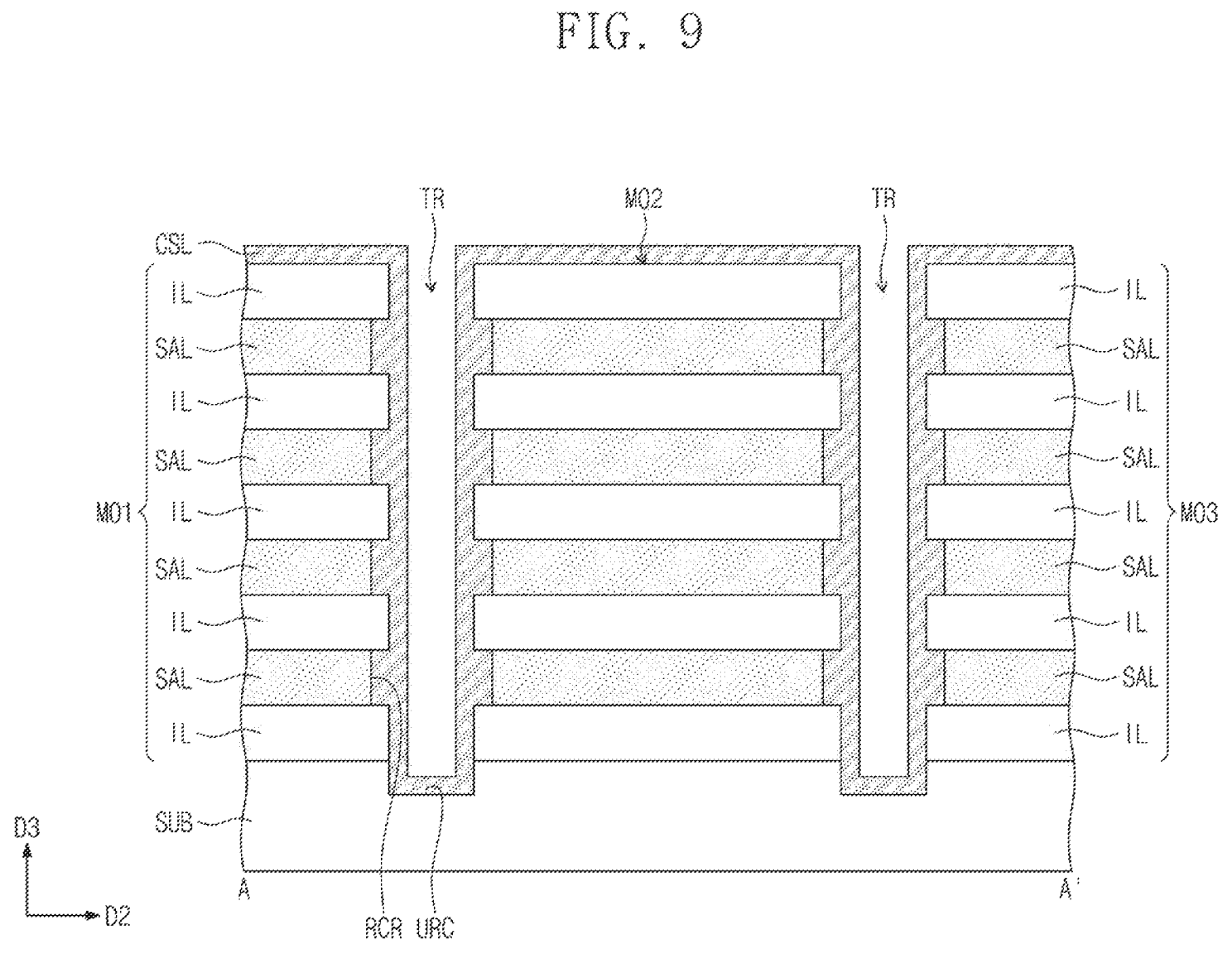

Referring to FIGS. 8 and 9, a semiconductor layer CSL may be conformally formed in the trench TR. The semiconductor layer CSL may be formed using a deposition process (e.g., an atomic layer deposition (ALD) process or a chemical vapor deposition (CVD) process). For example, the semiconductor layer CSL may be formed of or include amorphous silicon. The semiconductor layer CSL may be formed to fully fill the recess regions RCR. In an embodiment, the semiconductor layer CSL may be formed to fully fill the upper recess URC.

A thermal treatment process may be performed to crystalize the exposed portion of the semiconductor layer CSL. For example, the thermal treatment process may include a laser annealing process. Owing to the crystal structure of the substrate SUB made of single crystalline silicon, the crystalline structure of the semiconductor layer CSL may be changed from the amorphous structure to a single crystalline structure, during the thermal treatment process.

Figure 10:
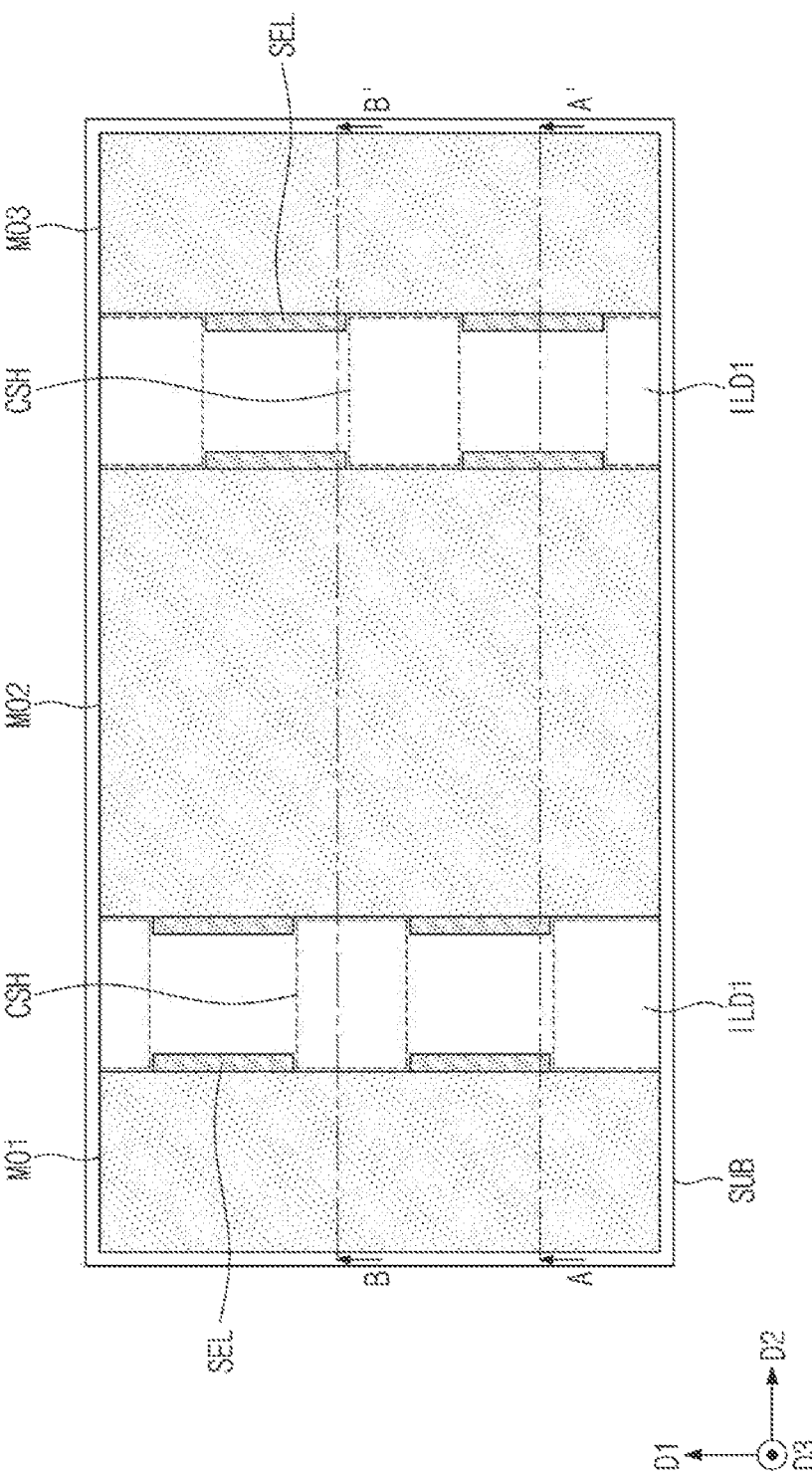
Figure 11A:
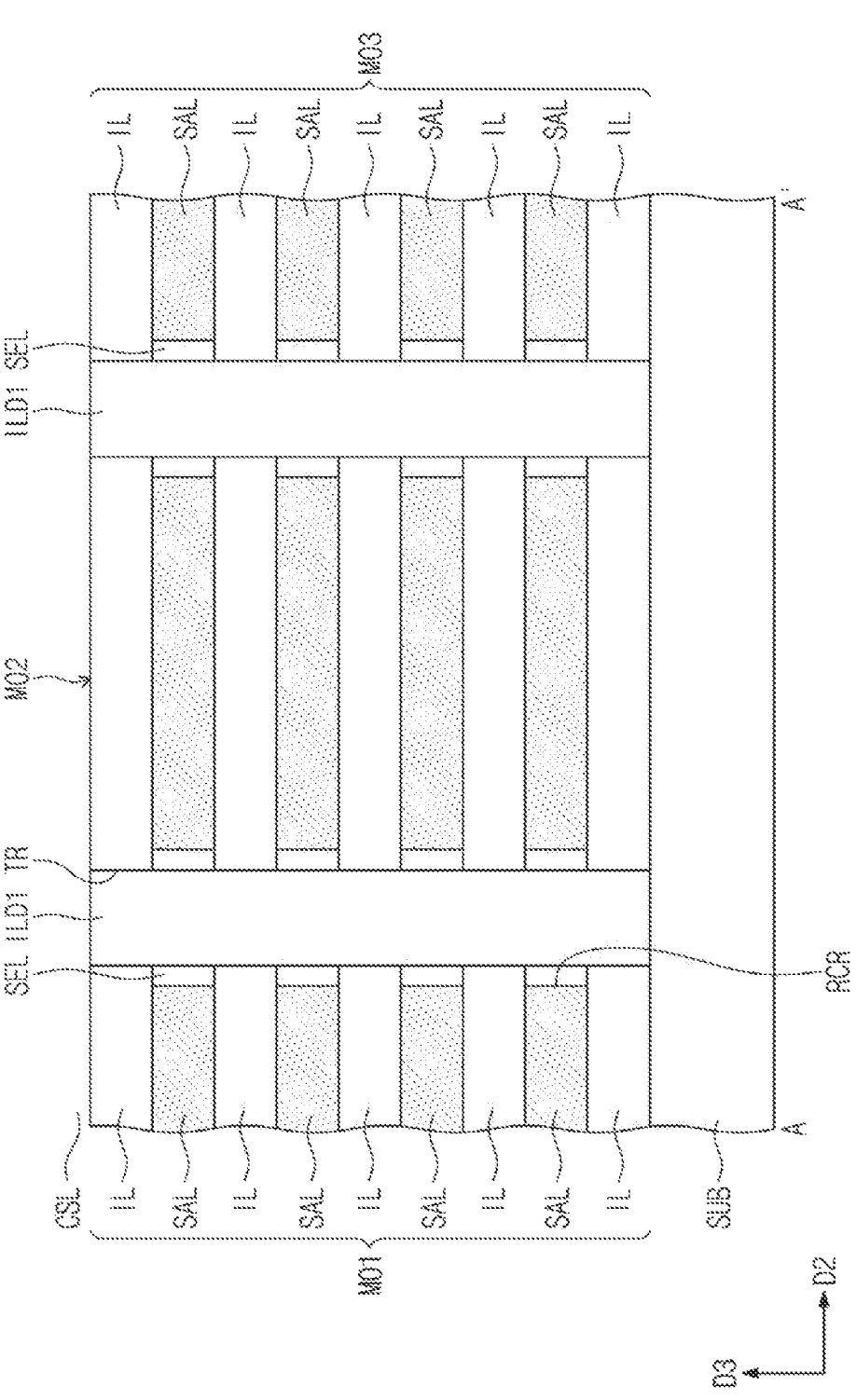
Figure 11B:
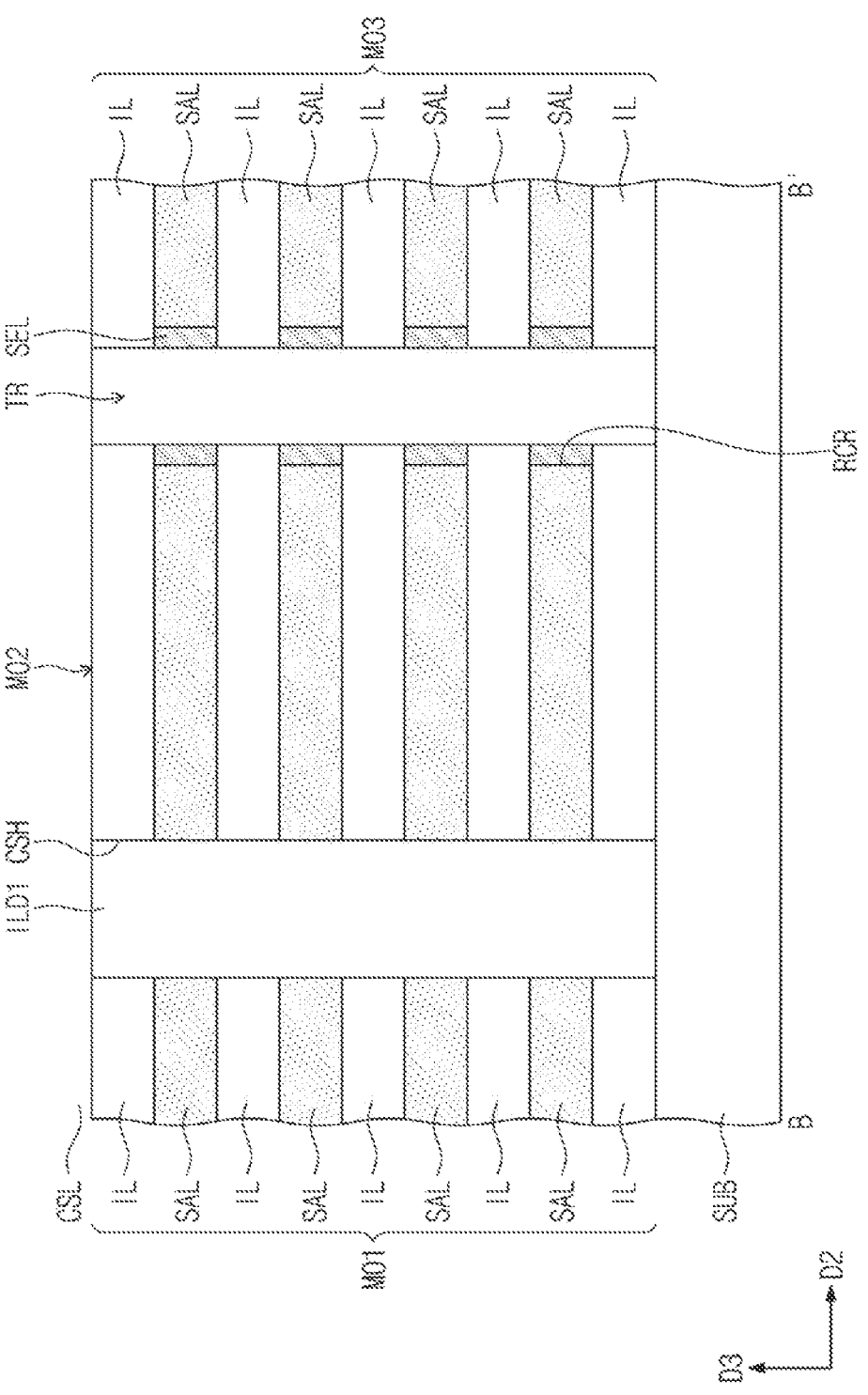

Referring to FIGS. 10, 11A, and 11B, a wet etching process may be performed on the semiconductor layer CSL in the trench TR to locally leave the semiconductor layer CSL in only the recess regions RCR. For example, side surfaces of the insulating layers IL may be exposed through the trench TR by the wet etching process. The semiconductor layer CSL in the upper recess URC (see FIG. 9) may also be left to constitute a portion of the substrate SUB. Thereafter, the first interlayer insulating layer ILD1 may be formed in the trench TR. For example, the first interlayer insulating layer ILD1 may be formed of or include at least one of silicon oxide, silicon nitride, or silicon oxynitride.

A plurality of channel separation holes CSH may be formed by performing an anisotropic etching process on the first interlayer insulating layer ILD1 in the trench TR. Due to the channel separation hole CSH, the semiconductor layer CSL may be split or divided into a plurality of channel layers SEL. The channel layers SEL may be horizontally spaced apart from each other by the channel separation hole CSH. The channel layers SEL may be vertically separated from each other by the recess region RCR. The first interlayer insulating layer ILD1 may be formed by filling the channel separation holes CSH with an insulating material.

Figure 12:
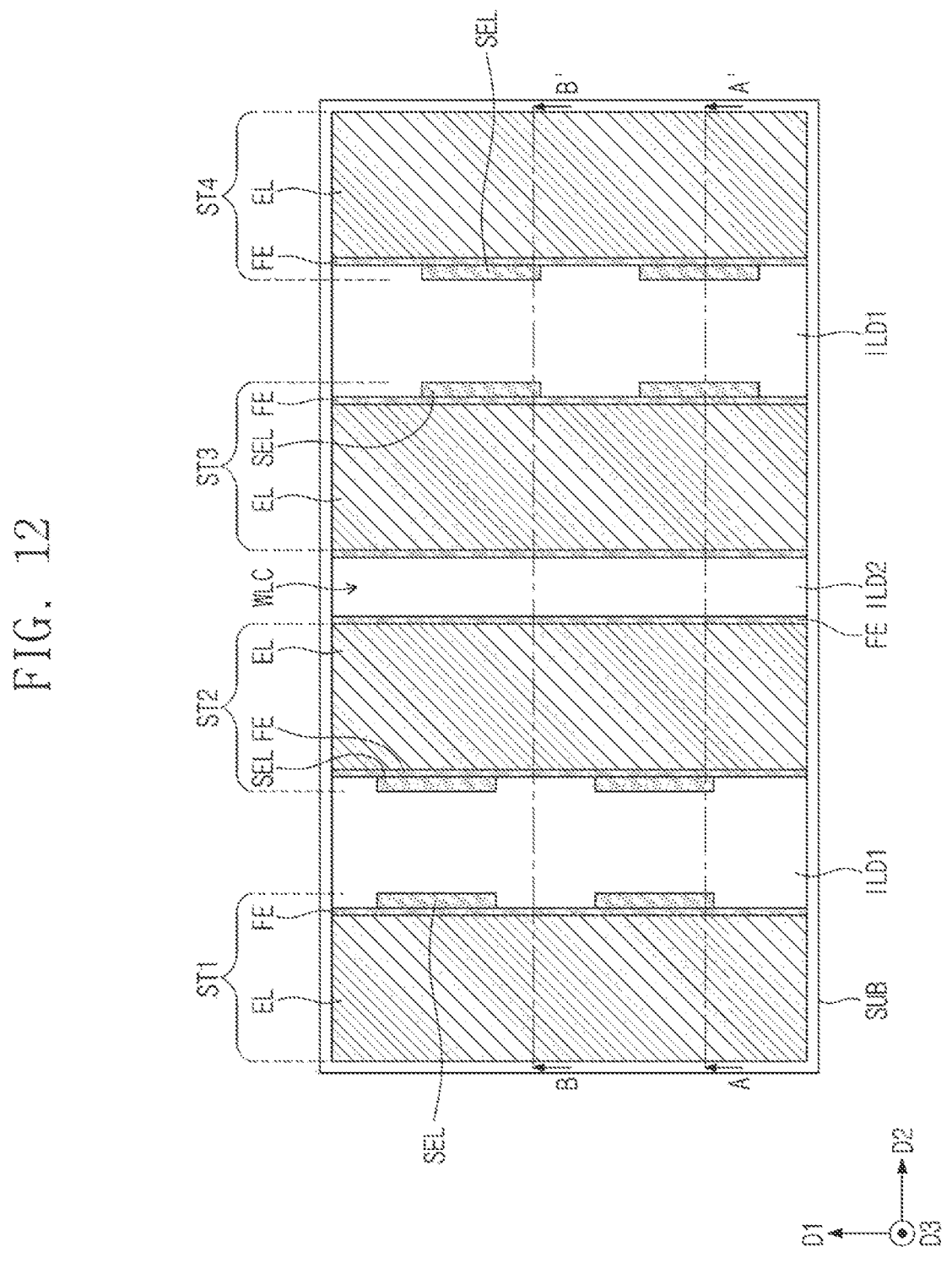
Figure 13A:
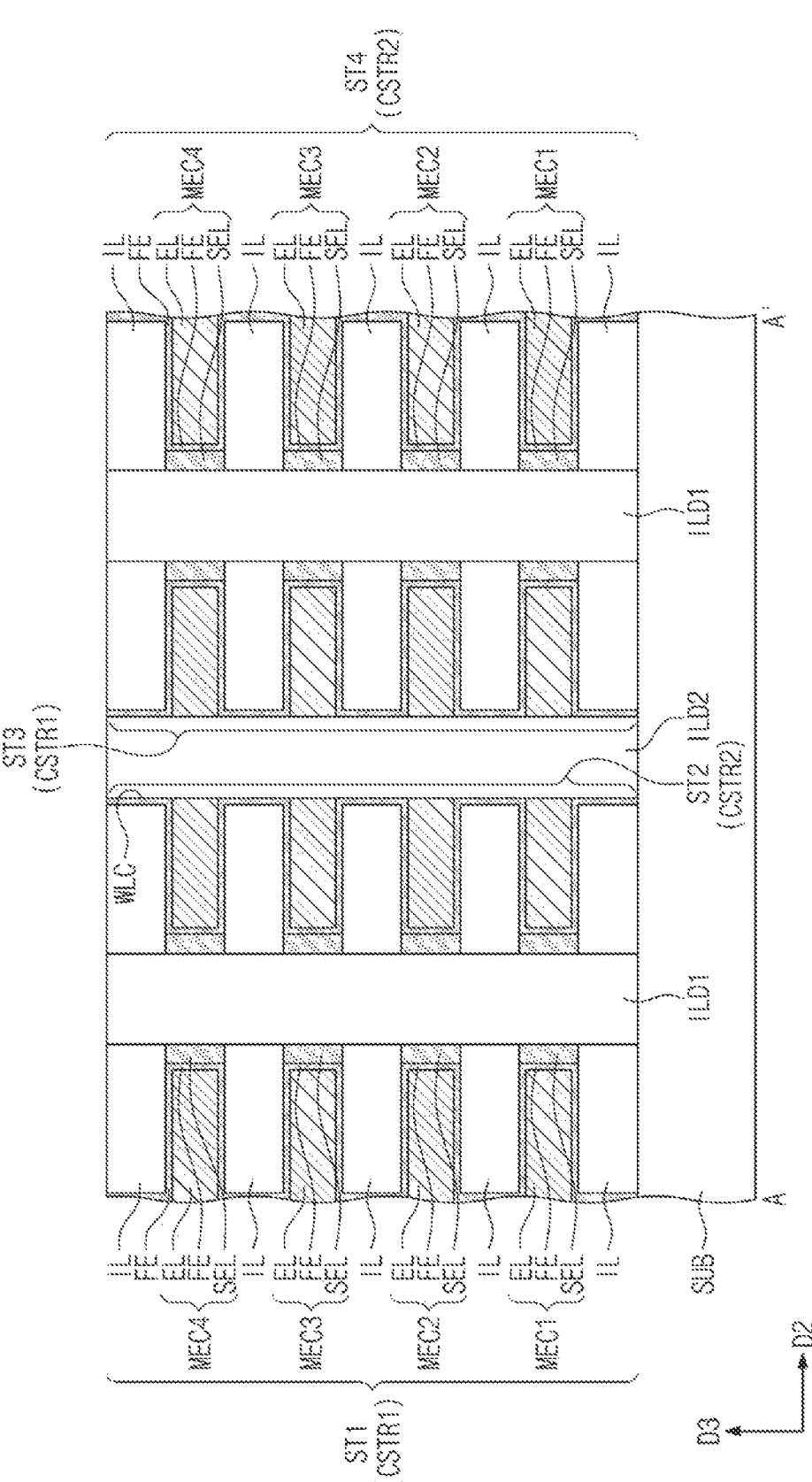
Figure 13B:
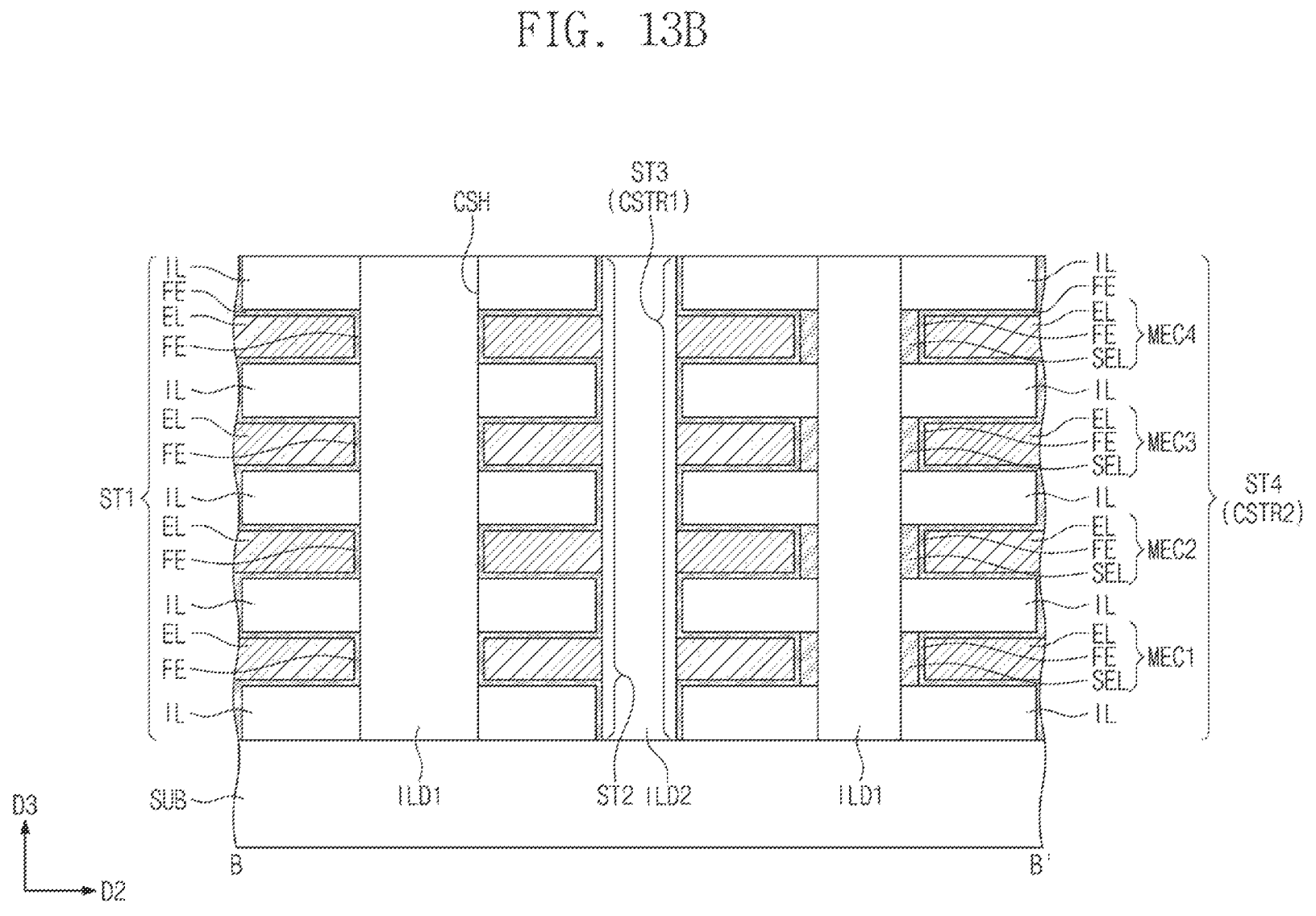

Referring to FIGS. 12, 13A, and 13B, the cut region WLC may be formed to cut a second mold structure MO2. The cut region WLC may be a trench-shaped empty region extended in the first direction D1.

The sacrificial layers SAL, which are exposed through the cut region WLC, may be selectively removed. The selective removal of the sacrificial layers SAL may include performing a wet etching process on the sacrificial layers SAL.

The ferroelectric layer FE may be conformally formed in a region, which is formed by removing the sacrificial layer SAL. The ferroelectric layer FE may be formed using a deposition process (e.g., an atomic layer deposition (ALD) process or a chemical vapor deposition (CVD) process). In an embodiment, the ferroelectric layer FE may be formed of a Hf-based compound exhibiting a ferroelectric property. The ferroelectric layer FE may be formed to directly cover a side surface of the channel layer SEL.

The electrodes EL may be formed on the ferroelectric layer FE. The electrodes EL may be respectively formed in the regions, which are formed by removing the sacrificial layers SAL. The electrodes EL may be stacked to be vertically spaced apart from each other.

The stacked electrodes EL, the stacked channel layers SEL, and the ferroelectric layer FE therebetween may constitute the stacks ST1-ST4. In detail, the first to fourth stacks ST1-ST4, which are arranged in the second direction D2, may be formed on the substrate SUB. The cut region WLC may be defined between the second and third stacks ST2 and ST3. The second interlayer insulating layer ILD2 may be formed in the cut region WLC.

Referring to FIGS. 14, 15A, 15B, and 15C, a pair of through holes TRH may be formed between a pair of the channel layers SEL, which are adjacent to each other in the second direction D2. The through holes TRH may be formed by an anisotropic etching process on the first interlayer insulating layer ILD1. The through holes TRH may be formed to partially expose a top surface of the substrate SUB.

The liner layer LIN may be conformally formed on an inner side surface of the through hole TRH. An anisotropic etching process may be performed on the liner layer LIN to form the liner layer LIN in the spacer shape. In other words, the substrate SUB may be still exposed to the outside through the through hole TRH. The liner layer LIN may cover the stacked channel layers SEL. That is, due to the liner layer LIN, the channel layers SEL may not be exposed to the outside.

A selective epitaxial growth process may be performed on the substrate SUB exposed by the through hole TRH to form a semiconductor pattern protruding from the substrate SUB. An oxidation process may be performed on the semiconductor pattern to form the insulating pattern OSG in a lower portion of the through hole. The insulating pattern OSG may be enclosed by the liner layer LIN. The liner layer LIN may protect the stacked channel layers SEL from the oxidation process or may prevent the stacked channel layers SEL from being oxidized.

Referring to FIGS. 16, 17A, 17B, and 17C, the liner layer LIN, which is exposed through the through hole TRH, may be removed. Accordingly, the liner layer LIN may be locally left in only regions between the lowermost one of the insulating layers IL and the insulating pattern OSG. As a result of the removal of the liner layer LIN, the stacked channel layers SEL may be exposed through the through hole TRH.

The first conductive pillar SLP and the second conductive pillar BLP may be respectively formed in a pair of the through holes TRH, which are adjacent to each other in the first direction D1. The first and second conductive pillars SLP and BLP may be formed between a pair of the channel layers SEL, which are adjacent to each other in the second direction D2. The first conductive pillar SLP and the second conductive pillar BLP may be adjacent to each other in the first direction D1.

Between the first and second stacks ST1 and ST2, the first and second conductive pillars SLP and BLP may be alternately formed in the first direction D1. Between the third and fourth stacks ST3 and ST4, the first and second conductive pillars SLP and BLP may be alternately formed in the first direction D1.

The formation of the first and second conductive pillars SLP and BLP may include filling an empty region on the insulating pattern OSG with a conductive material. The conductive pillar SLP or BLP may be electrically disconnected from the substrate SUB by the insulating pattern OSG.

Referring back to FIGS. 2 and 3A to 3C, the third interlayer insulating layer ILD3 may be formed on the first to fourth stacks ST1-ST4. A plurality of interconnection lines, which are extended in the second direction D2, may be formed on the third interlayer insulating layer ILD3. The plurality of interconnection lines may include the first and second bit lines BL1 and BL2 and the first and second source lines SL1 and SL2. The contacts CNT may be formed to electrically connect the first source and bit lines SL1 and BL1 to the first and second conductive pillars SLP and BLP between the first and second stacks ST1 and ST2. The contacts CNT may be formed to electrically connect the second source and bit lines SL2 and BL2 to the first and second conductive pillars SLP and BLP between the third and fourth stacks ST3 and ST4.

Figure 18:
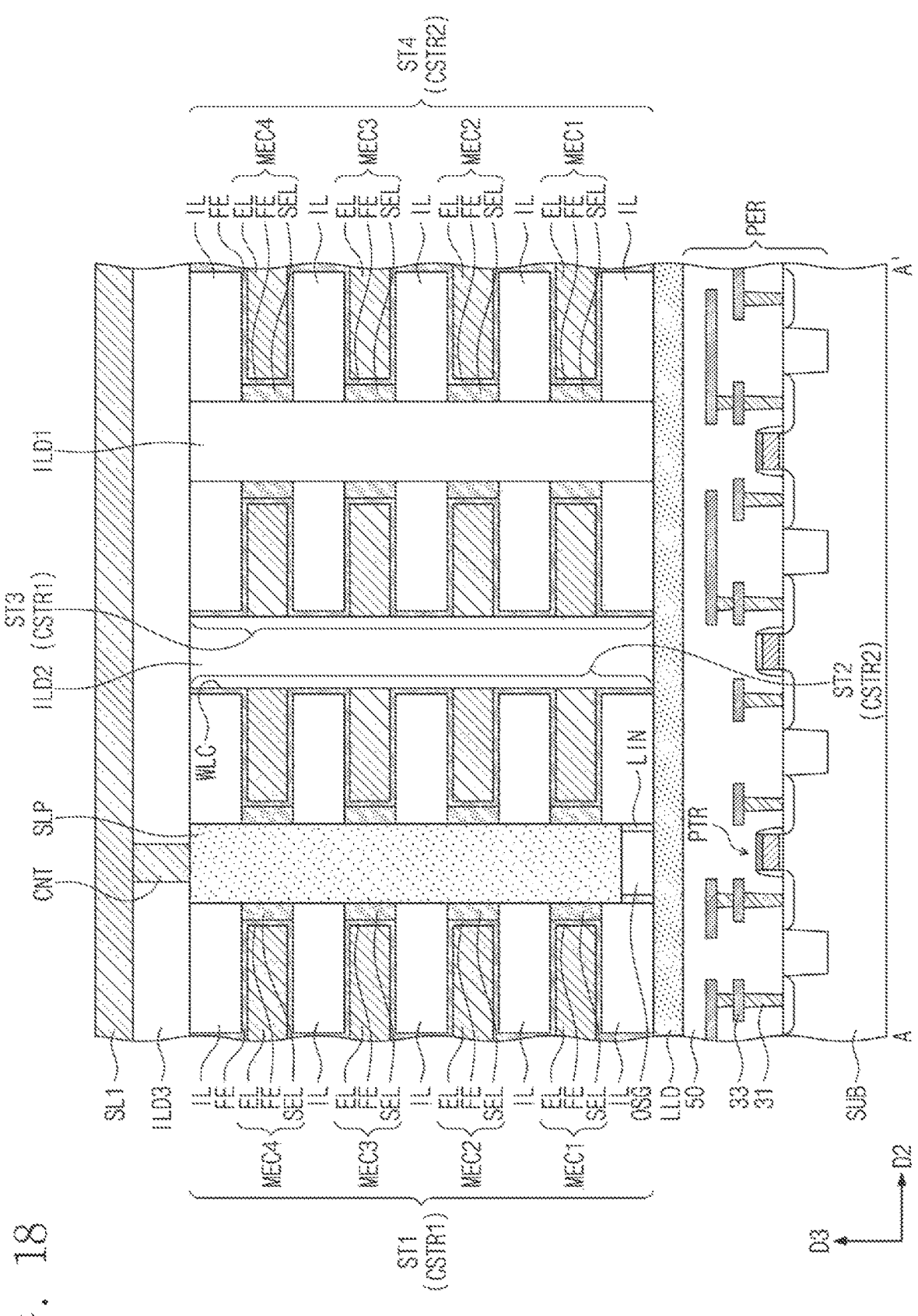
FIGS. 18, 19, and 20 are sectional views, each of which illustrates a three-dimensional semiconductor memory device according to some embodiments.
Figure 19:
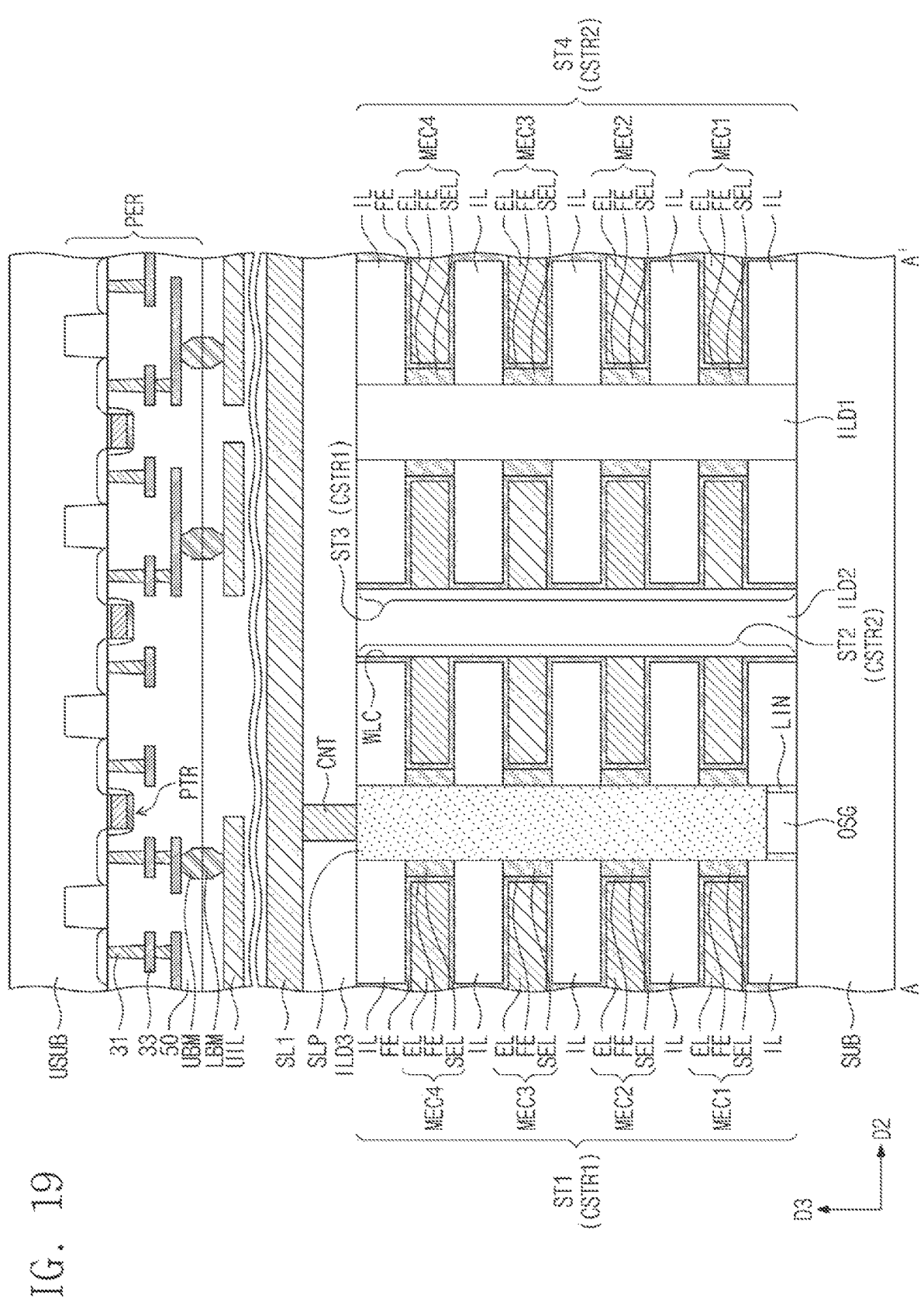
Figure 20:
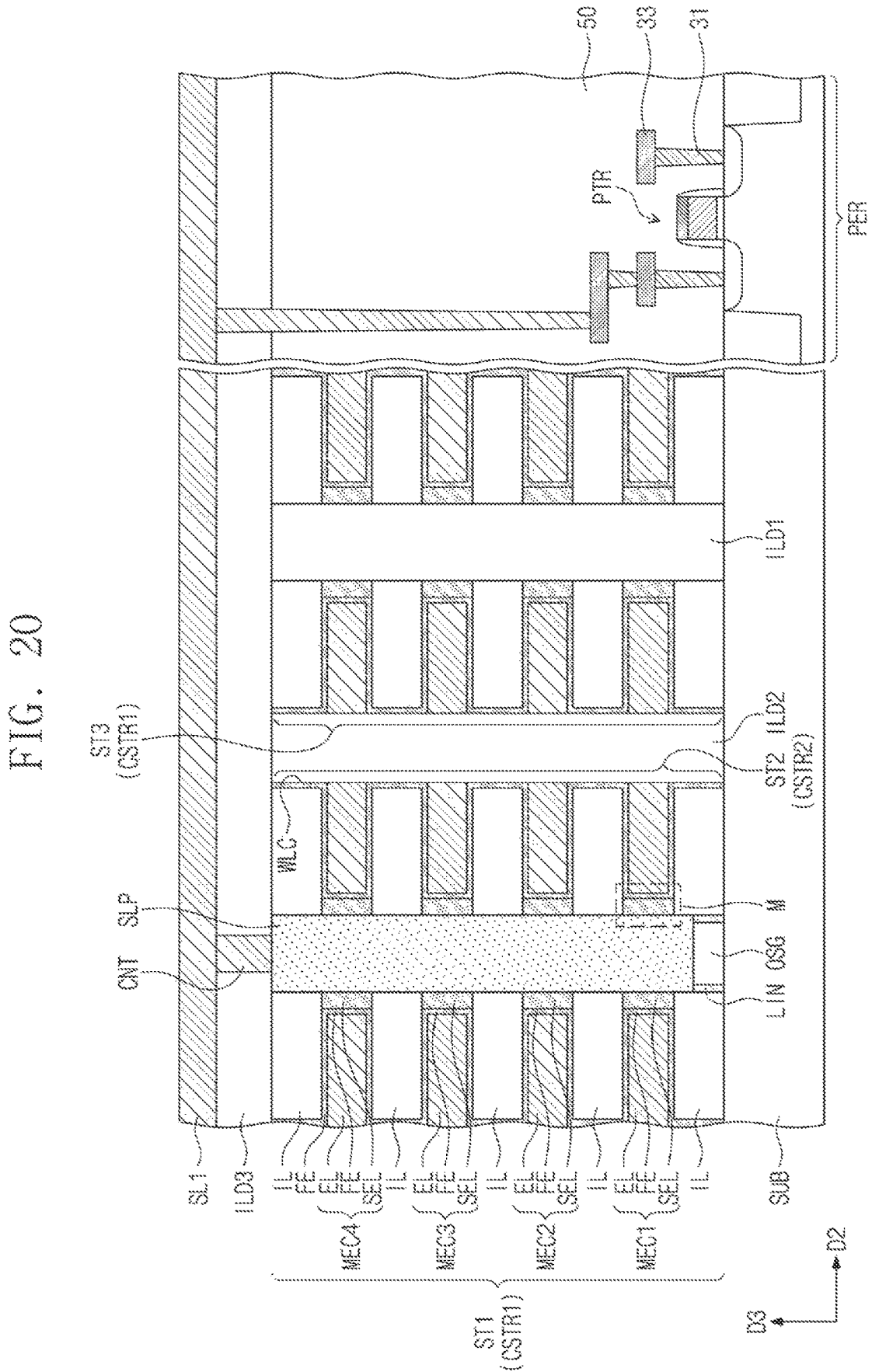

FIGS. 18, 19, and 20 are sectional views, each of which illustrates a three-dimensional semiconductor memory device according to some embodiments.

Referring to FIG. 18, a peripheral circuit layer PER may be provided on the substrate SUB. The peripheral circuit layer PER may be interposed between the substrate SUB and the stacks ST1-ST4. In other words, the peripheral circuit layer PER may be provided below a memory cell array, which is composed of the stacks ST1-ST4. A lower insulating layer LLD may be provided between the peripheral circuit layer PER and the stacks ST1-ST4. The semiconductor memory device according to some embodiments may have a cell-on-peripheral (COP) structure.

The peripheral circuit layer PER may include a plurality of peripheral transistors PTR and a plurality of peripheral interconnection lines 33, which are provided on the substrate SUB. The peripheral transistors PTR and the peripheral interconnection lines 33 may be covered with an interlayer insulating layer 50. The peripheral interconnection lines 33 may be provided on the peripheral transistors PTR and may be connected to the peripheral transistors PTR through contacts 31.

In an embodiment, the peripheral circuit layer PER may include sense amplifiers, row decoders, and/or sub-word line drivers, which are electrically connected to the memory cells MEC1-MEC4.

Referring to FIG. 19, a peripheral circuit layer PER and an upper substrate USUB may be provided on a memory cell array, which is composed of the stacks ST1-ST4. The peripheral circuit layer PER may be provided to have substantially the same features as that described with reference to FIG. 18 and thus a repeated description thereof is omitted for conciseness. The semiconductor memory device according to some embodiments may be a chip-to-chip (C2C) structure.

The peripheral circuit layer PER may be provided to face the substrate SUB. In other words, the upper substrate USUB may be located at the uppermost level of the semiconductor memory device and may be exposed to the outside. Upper interconnection lines UIL and lower bonding metals LBM may be provided at the uppermost level of the memory cell array. The lower bonding metals LBM may be provided on the upper interconnection lines UIL, respectively. The upper interconnection lines UIL may be provided in the uppermost metal layer, which is located at a level higher than the first bit and source lines BL1 and SL1 and the second bit and source lines BL2 and SL2.

Upper bonding metals UBM may be provided at the lowermost level of the peripheral circuit layer PER. The upper bonding metals UBM may be connected to the peripheral interconnection lines 33, respectively. Each of the lower bonding metals LBM may be connected to a corresponding one of the upper bonding metals UBM by a metal bonding method. For example, the metal bonding method may be a Cu—Cu bonding method. Since the lower and upper bonding metals LBM and UBM are connected to each other, the memory cells MEC1-MEC4 may be connected to the peripheral circuit layer PER.

Referring to FIG. 20, the peripheral circuit layer PER may be provided on a peripheral region of the substrate SUB. The peripheral circuit layer PER may be disposed beside the memory cell array including the stacks ST1-ST4. The peripheral circuit layer PER may be configured to have substantially the same features as that in the embodiment of FIG. 18.

The first bit and source lines BL1 and SL1 and the second bit and source lines BL2, SL2 may be extended from the memory cell array to a region on the peripheral circuit layer PER. The peripheral interconnection line 33 of the peripheral circuit layer PER may be electrically connected to the line BL1, SL1, BL2, or SL2 through a penetration via TV.

As described above, in a three-dimensional semiconductor memory device according to some embodiments, a single crystalline semiconductor material may be used in a channel layer connecting the first and second conductive pillars, which are adjacent to each other. The carrier mobility may be increased by using the single crystalline semiconductor material. The channel layers in the memory cells may be separated from each other. Accordingly, a leakage current between adjacent ones of the memory cells may be prevented. As a result, electrical characteristics of the semiconductor device may be improved.

While example embodiments have been particularly shown and described, it will be understood by one of ordinary skill in the art that variations in form and detail may be made therein without departing from the spirit and scope of the attached claims.

What is claimed is:

1. A semiconductor memory device comprising:
   a cell string including a plurality of memory cells, the plurality of memory cells being stacked on a substrate to be spaced apart from each other; and
   a first conductive pillar and a second conductive pillar connected to the cell string,
   wherein the first conductive pillar is spaced apart from the second conductive pillar in a first direction, wherein each of the plurality of memory cells comprises:

a channel layer that extends from the first conductive pillar to the second conductive pillar in the first direction;

a ferroelectric layer on the channel layer; and an electrode on the ferroelectric layer, wherein the channel layer comprises single crystalline silicon, and wherein the channel layers of the plurality of memory cells are spaced apart from each other in a vertical direction that is orthogonal to a top surface of the substrate.

2. The semiconductor memory device of claim 1, wherein the ferroelectric layer covers a top surface, a bottom surface, and a first side surface of the electrode and exposes a second side surface, which is opposite to the first side surface of the electrode.

3. The semiconductor memory device of claim 2, wherein the ferroelectric layer covers a side surface of the channel layer, and an opposite side surface of the channel layer is connected to the first conductive pillar and to the second conductive pillar.

4. The semiconductor memory device of claim 1, wherein the ferroelectric layer comprises a hafnium-based oxide containing at least one impurity selected from the group consisting of Zr, Si, Al, Y, Gd, La, Sc, and Sr.

5. The semiconductor memory device of claim 1, wherein the ferroelectric layer comprises a first layer and a second layer, which are sequentially stacked, one of the first layer and the second layer comprises a ferroelectric material, and a remaining one of the first layer and the second layer comprises a paraelectric material.

6. The semiconductor memory device of claim 1, wherein each of the plurality of memory cells further comprises:

a first metal pattern between the channel layer and the ferroelectric layer; and a second metal pattern between the ferroelectric layer and the electrode.

7. The semiconductor memory device of claim 1, further comprising insulating patterns, which are respectively interposed between the first conductive pillar and the second conductive pillar and the substrate.

8. The semiconductor memory device of claim 1, wherein the electrode has a line shape extending along the first direction.

9. The semiconductor memory device of claim 1, further comprising:

a peripheral circuit layer on the substrate, the peripheral circuit layer comprising peripheral transistors; and an interlayer insulating layer on the substrate, the interlayer insulating layer covering the peripheral transistors.

10. A semiconductor memory device comprising:

a stack on a substrate;

a conductive pillar, which is provided adjacent to the stack and extends in a vertical direction that is orthogonal to a top surface of the substrate; and an insulating pattern between the conductive pillar and the substrate, wherein the stack comprises:

electrodes stacked on the substrate;

a ferroelectric layer covering the electrodes; and channel layers, which are respectively interposed between the electrodes and the conductive pillar, wherein the channel layers are spaced apart from each other in the vertical direction, and wherein the insulating pattern electrically disconnects the conductive pillar from the substrate.

11. The semiconductor memory device of claim 10, wherein the insulating pattern comprises an oxidized semiconductor layer grown from the substrate.

12. The semiconductor memory device of claim 10, wherein the channel layers are single crystalline silicon patterns, which are split to be spaced apart from each other.

13. The semiconductor memory device of claim 10, wherein the ferroelectric layer covers a top surface, a bottom surface, and a first side surface of each of the electrodes and exposes a second side surface of each of the electrodes, and the second side surface is opposite to the first side surface.

14. The semiconductor memory device of claim 13, wherein the ferroelectric layer covers a side surface of each of the channel layers, and an opposite side surface of each of the channel layers is connected to the conductive pillar.

15. A semiconductor memory device comprising:

a first cell string and a second cell string on a substrate; and a first conductive pillar and a second conductive pillar between the first cell string and the second cell string, wherein the first conductive pillar is spaced apart from the second conductive pillar in a first direction, wherein the first cell string is spaced apart from the second cell string in a second direction, wherein each of the first cell string and the second cell string comprises:

electrodes stacked on the substrate;

channel layers, which are respectively disposed adjacent to the electrodes and are spaced apart from each other in a third direction that is orthogonal to the first direction and the second direction, each of the channel layers connecting the first conductive pillar to the second conductive pillar; and a ferroelectric layer interposed between the electrodes and the channel layers, and wherein the ferroelectric layer covers a top surface, a bottom surface, and a first side surface of each of the electrodes.

16. The semiconductor memory device of claim 15, wherein the ferroelectric layer exposes a second side surface of each of the electrodes, and the second side surface is opposite to the first side surface in the second direction.

17. The semiconductor memory device of claim 15, wherein the channel layers are single crystalline silicon patterns, which are split to be spaced apart from each other.

18. The semiconductor memory device of claim 15, wherein each of the channel layers has a bar shape extending in the first direction from the first conductive pillar to the second conductive pillar.

19. The semiconductor memory device of claim 15, further comprising insulating patterns, which are respectively interposed between the first conductive pillar to the second conductive pillar and the substrate.

* * * * *